United States Patent
Tanaka

(10) Patent No.: US 7,569,441 B2
(45) Date of Patent: Aug. 4, 2009

(54) LASER IRRADIATION APPARATUS, LASER IRRADIATION METHOD, AND METHOD FOR MANUFACTURING SEMICONDUCTOR DEVICE

(75) Inventor: Koichiro Tanaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 460 days.

(21) Appl. No.: 11/583,721

(22) Filed: Oct. 20, 2006

(65) Prior Publication Data
US 2007/0037332 A1 Feb. 15, 2007

Related U.S. Application Data

(62) Division of application No. 10/787,191, filed on Feb. 27, 2004, now Pat. No. 7,125,761.

(30) Foreign Application Priority Data
Feb. 28, 2003 (JP) ............................. 2003-054768

(51) Int. Cl.
*H01L 21/84* (2006.01)
(52) U.S. Cl. ............................. 438/166; 257/E21.561
(58) Field of Classification Search ......... 438/151–166; 257/E21.561
See application file for complete search history.

(56) References Cited

U.S. PATENT DOCUMENTS 5,304,357 A 4/1994 Sato et al.

(Continued)

FOREIGN PATENT DOCUMENTS

JP 04-124813 4/1992

(Continued)

OTHER PUBLICATIONS

M. Hatano et al., *12.4L: Late-News Paper: Selectively Enlarging Laser Crystallization Technology for High and Uniform Performance Poly-Si TFTs*, SID 02 Digest, 2002, pp. 158-161.

*Primary Examiner*—Richard A. Booth
(74) *Attorney, Agent, or Firm*—Eric J. Robinson; Robinson Intellectual Property Law Office, P.C.

(57) ABSTRACT

An aggregation of crystals extending long in the scanning direction (a long crystal grain region) is formed when a continuous wave laser oscillator (a CW laser oscillator) is employed for annealing the semiconductor film in the manufacturing process of a semiconductor device. The long crystal grain region has a characteristic similar to that of single crystal in the scanning direction, but there is restriction for high integration because of the small output of the CW laser oscillator.

In order to solve the problem, a pulsed laser beam 1 having a wavelength absorbed sufficiently in the semiconductor film is used in combination with a laser beam 2 having a high output and having a wavelength absorbed sufficiently in the melted semiconductor film. After irradiating the laser beam 1 to melt the semiconductor widely, the laser beam 2 is irradiated to the melted region. And then the laser beam 2 and the semiconductor film are moved relatively while keeping the melting state so as to form the long crystal grain region. The laser beam 2 keeps to be irradiated to the semiconductor film until the laser beam 1 is irradiated, and the output of the laser beam 2 is attenuated when the laser beam 1 is irradiated so as not to give the energy more than is needed so that the very uniform laser annealing becomes possible. Thus the long crystal grain region having a width 10 times as broad as the conventional one can be formed.

13 Claims, 17 Drawing Sheets

U.S. PATENT DOCUMENTS

| | | |
|---|---|---|
| 5,643,801 A | 7/1997 | Ishihara et al. |
| 5,643,826 A | 7/1997 | Ohtani et al. |
| 5,897,799 A | 4/1999 | Yamazaki et al. |
| 5,900,980 A | 5/1999 | Yamazaki et al. |
| 5,923,962 A | 7/1999 | Ohtani et al. |
| 5,953,597 A | 9/1999 | Kusumoto et al. |
| 5,959,779 A | 9/1999 | Yamazaki et al. |
| 6,002,523 A | 12/1999 | Tanaka |
| 6,038,075 A | 3/2000 | Yamazaki et al. |
| 6,544,825 B1 | 4/2003 | Yamazaki |
| 6,548,370 B1 | 4/2003 | Kasahara et al. |
| 6,730,550 B1 | 5/2004 | Yamazaki et al. |
| 7,160,764 B2 | 1/2007 | Tanaka |
| 2002/0004292 A1 | 1/2002 | Yamazaki et al. |
| 2002/0031876 A1 | 3/2002 | Hara et al. |
| 2002/0048864 A1 | 4/2002 | Yamazaki et al. |
| 2004/0069751 A1 | 4/2004 | Yamazaki et al. |
| 2005/0181550 A1* | 8/2005 | Tanaka ........................ 438/150 |
| 2006/0019474 A1 | 1/2006 | Inui et al. |
| 2007/0184590 A1* | 8/2007 | Tanaka et al. ............... 438/166 |
| 2007/0254392 A1 | 11/2007 | Tanaka |

FOREIGN PATENT DOCUMENTS

| | | |
|---|---|---|
| JP | 05-021340 | 1/1993 |
| JP | 05-031354 | 2/1993 |
| JP | 06-163406 | 6/1994 |
| JP | 06-345415 | 12/1994 |
| JP | 07-183540 | 7/1995 |
| JP | 07-187890 | 7/1995 |
| JP | 08-148423 | 6/1996 |
| JP | 11-307450 | 11/1999 |
| JP | 2000-012484 | 1/2000 |
| JP | 2001-044120 | 2/2001 |
| JP | 2002-289524 | 10/2002 |
| JP | 2004-039660 | 2/2004 |

* cited by examiner

—·—·—·—·— pulsed laser beam 1

— — — — — laser beam 2

LASER IRRADIATION APPARATUS, LASER IRRADIATION METHOD, AND METHOD FOR MANUFACTURING SEMICONDUCTOR DEVICE

BACKGROUND OF THE INVENTION

1. Field of the Invention

The present invention relates to a laser irradiation method and a laser irradiation apparatus to perform the laser irradiation (the laser irradiation apparatus includes a laser oscillator and an optical system to guide a laser beam emitted from the laser oscillator to an object to be irradiated.). In addition, the present invention relates to a method for manufacturing a semiconductor device using the laser irradiation method and the laser irradiation apparatus to perform the laser irradiation. It is noted that the semiconductor device described in this specification includes a general device that can be operated by utilizing the semiconductor characteristic. And thereby a computer, an electro-optical device and the like having the semiconductor device as its component are also included in the semiconductor device.

2. Description of the Related Art

In recent years, research has been extensively conducted on the technology to crystallize an amorphous semiconductor film formed over an insulating substrate such as a glass substrate and to form a semiconductor film having a crystal structure (hereinafter referred to as a crystalline semiconductor film). As the crystallizing method, a thermal annealing method using an annealing furnace, a rapid thermal annealing method (RTA method), a laser annealing method and the like have been examined. It is possible to employ one of these methods or a combination of these methods in crystallization.

The crystalline semiconductor film has a much higher mobility than the amorphous semiconductor film. Therefore, the crystalline semiconductor film is utilized for forming a thin film transistor (TFT), and is further utilized for an active matrix liquid crystal display device and the like with TFT for a pixel portion or both TFT for the pixel portion and TFT for a driver circuit formed over one glass substrate.

Usually, in order to crystallize the amorphous semiconductor film in the annealing furnace, the heating process needs to be performed at a temperature of not less than 600° C. for 10 hours or more. It is quartz that is suitable for a material of a substrate applicable for this crystallization, but a quartz substrate is expensive and is very difficult to be processed into a large substrate. Enlarging the size of the substrate is considered to be one of the means to increase production efficiency, and that is why the research has been done to form a semiconductor over a glass substrate which is inexpensive and which can be easily processed into a large substrate. Recently, it has been examined to use the glass substrate with a side of 1 m or more.

As an example of the research, the thermal crystallization method with metal element disclosed in the published unexamined patent application no. H7-183540 makes it possible to lower the temperature of crystallization that has been regarded as a problem in the conventional method. According to the thermal crystallization method with metal element, the crystalline semiconductor film can be formed by adding a minute amount of nickel, palladium, lead or the like to the amorphous semiconductor film and then heating it at a temperature of 550° C. for four hours. The temperature of 550° C. is lower than the distortion temperature of the glass substrate, and thereby it is not necessary to worry about its deformation and the like.

On the other hand, the laser annealing method makes it possible to give high energy only to the semiconductor film without increasing the temperature of the substrate. Therefore, the laser annealing method is attracting attention because this method can be employed not only to the glass substrate whose distortion temperature is low, but also a plastic substrate and the like.

An example of the laser annealing method is explained as follows. A pulsed laser beam generated from a pulsed laser oscillator, typically an excimer laser, is shaped into square with several centimeters on a side or linear having a length of 100 mm or more on a surface to be irradiated and the laser beam is moved relatively to the object to be irradiated to perform annealing. It is noted that "linear" here does not mean a line strictly but means a rectangle (or an oblong) with a large aspect ratio. For example, linear indicates a rectangle with an aspect ratio of two or more (preferably from 10 to 10000), which is included in a laser beam that is rectangular in shape at the surface to be irradiated (rectangular beam). The laser beam is shaped into linear in order to secure energy density for sufficient annealing to the object to be irradiated though the laser beam may have the rectangular shape or a planar shape when sufficient annealing can be performed to the object to be irradiated.

The crystalline semiconductor film thus manufactured has a plurality of crystal grains assembled and a position and a size of each crystal grain are random. TFT formed over the glass substrate is formed by patterning the crystalline semiconductor film into island shape in order for isolation. In such a case, it was not possible to form the crystal grains as specifying their positions and sizes. Compared to the inside of the crystal grain, the boundary between the crystal grains (crystal grain boundary) has an amorphous structure and an infinite number of recombination centers and trapping centers existing due to crystal defects. It is known that when a carrier is trapped in the trapping center, potential of the crystal grain boundary increases to become a barrier against the carrier, and therefore a current transporting characteristic of the carrier is lowered. Although the crystallinity of the semiconductor film in a channel forming region has a serious influence on characteristics of the TFT, it was almost impossible to form the channel forming region with a single-crystal semiconductor film by eliminating such an influence of the crystal grain boundary.

Recently, attention has been paid to the technique of irradiating continuous wave (CW) laser beam to a semiconductor film while scanning the CW laser beam in one direction to form a single-crystal grain extending long in the scanning direction. A region in which such single-crystal grains are assembled is referred to as a long crystal grain region in this specification. It is considered that it is possible, with this technique, to form a TFT that has almost no crystal grain boundary at least in the channel direction thereof. (for example, US published patent application 2002/0031876 A1)

However, in the crystallizing method using the CW laser oscillator, when a CW YAG laser is used for example, since the CW laser beam having wavelengths absorbed sufficiently in the semiconductor film is utilized, the CW laser beam had to be converted into a harmonic. Therefore, only the laser oscillator that outputs as low as 10 W is utilized, and it is inferior to the excimer laser in terms of productivity. When the CW laser oscillator having a wavelength of 532 nm with an output of 10 W is used to crystallize the semiconductor film having a thickness of about 50 nm, a size of the beam spot has to be made as small as $10^{-3}$ mm$^2$ approximately, for example. Here, the output means a power of the laser beam, which is energy per unit time. On the other hand, when an excimer laser is employed, the beam spot can be made as large as 1 cm². It is noted that the CW laser oscillator with high output, having a wavelength not longer than that of visible light and having a considerably high stability is appropriate in this method. For example, a second harmonic of a YVO$_4$ laser, a second harmonic of a YAG laser, a second harmonic of a YLF laser, a second harmonic of a YAlO$_3$ laser, an Ar laser and the like are applicable. Although the other higher harmonics are applicable for the annealing, they have a disadvantage of small output. It is the object of the present invention to decrease the disadvantage in productivity to a large degree as keeping the advantage of the crystallizing technique using the CW laser oscillator.

SUMMARY OF THE INVENTION

In the process to crystallize the semiconductor film with a CW laser beam, the technique to shape the laser beam into a long elliptical beam (hereinafter referred to as an elliptical beam) on a surface to be irradiated and to scan the elliptical beam to the direction of the minor axis thereof in order to crystallize the semiconductor film is usually employed to enhance productivity as much as possible. The beam spot is shaped into elliptical because the original shape of the laser beam emitted from a laser oscillator is circular or near circular. Alternatively, when the original shape is rectangular, it may be extended in one direction through a cylindrical lens or the like and may be used in the same way. In this specification, the elliptical beam and the rectangular beam are named generically as a long beam. A plurality of laser beams may be shaped into long beams respectively and be chained in order to make a longer beam. The present invention is to provide a method for irradiating a long beam, and an irradiation apparatus, which can enhance the processing efficiency in such a process.

A laser irradiation apparatus according to the present invention comprises a pulsed laser oscillator 1 outputting a wavelength not longer than that of visible light, means to shape a laser beam 1 emitted from the laser oscillator 1 into a long beam on a surface to be irradiated, a laser oscillator 2 outputting a fundamental wave, means to irradiate a laser beam 2 emitted from the laser oscillator 2 so as to overlap with a region where the laser beam 1 is irradiated in the surface to be irradiated, and means to move the surface to be irradiated in a first direction relatively to the laser beam 1 and the laser beam 2, wherein output of the laser oscillator 2 is modulated in synchronization with a period of the pulsed laser oscillator 1.

A laser oscillator outputting wavelengths sufficiently absorbed in the semiconductor film may be employed as the pulsed laser oscillator 1 having a wavelength not longer than that of visible light. Usually wavelengths not longer than that of visible light are absorbed in the semiconductor film sufficiently. As the laser oscillator 2 outputting the fundamental wave, a laser oscillator that can generate very high energy, and that can emit the laser beam absorbed sufficiently in the melted semiconductor film may be employed. The wavelength of the laser beam 2 is not limited to the fundamental wave. However, generally speaking, it is preferable to use the fundamental wave since the harmonic has low energy, and the laser oscillator having high output such as a YAG laser would generate the fundamental wave that can be absorbed in the melted semiconductor film sufficiently.

The reason why the present invention uses the laser oscillator 1 and the laser oscillator 2 simultaneously is explained as follows. First of all, a part of the semiconductor film is melted by the pulsed laser beam having wavelengths absorbed sufficiently in the semiconductor film (wavelengths not longer than that of visible light), that can anneal the semiconductor film even though the beam spot is made much larger than that of the CW laser beam. Then, the fundamental wave with an output 100 times or more compared with the CW laser beam having wavelengths not longer than that of visible light, for example with an output of 1000 W or more, (for example, Nd:YAG laser, fundamental wave) is irradiated to the melted semiconductor film as scanning the semiconductor film relatively to the fundamental wave. Although usually the fundamental wave is hardly absorbed in the semiconductor film, the absorption coefficient is increased drastically when the semiconductor film is melted so that the fundamental wave is sufficiently absorbed. This makes the part of the semiconductor film melted by the pulsed laser beam move in the semiconductor film as keeping its melting state with the irradiation of the fundamental wave. As a result, a plurality of crystal grains extending long in the direction thereof are formed. The time for which the melting state is kept depends on the balance of output of the pulsed laser beam and the fundamental wave. When the next pulsed laser beam is irradiated on the semiconductor film within the time frame for which the melting state can be kept, the annealing of the semiconductor film can be continued as keeping its melting state. In the extreme case, it is possible to find a condition in which once the semiconductor film is melted by the pulsed laser beam, only the irradiation of the CW laser beam is enough to keep its melting state. In such a case, after the pulsed laser beam is irradiated for only one shot, the CW laser beam is irradiated to keep the melting state.

According to the present invention, it becomes possible not to irradiate the CW laser beam excessively to the semiconductor film melted with the pulsed laser beam by synchronizing the modulation of the output of the laser oscillator 2 with the period of pulse oscillation of the laser oscillator 1. FIGS. 3A and 3B explain this. Firstly in FIG. 3A, the pulsed laser beam 1 having wavelengths absorbed sufficiently in the semiconductor film and the laser beam 2 having a wavelength of 1 μm approximately melt a large region in the semiconductor film. The output of the laser beam that is appropriate for melting the semiconductor film and that is appropriate for forming the long crystal grain region is defined as W0 in the figure, and the outputs of the respective laser beams are adjusted so that the total output of the pulsed laser beam 1 and the laser beam 2 becomes W0. In FIGS. 3A and 3B, the longitudinal axis shows the output of the laser beam, and the horizontal axis shows the time. After forming the melted region in the semiconductor film with the pulsed laser beam 1 and the laser beam 2, the output of the laser beam 2 is modulated when the output of the pulsed laser beam 1 begins to be attenuated, so as to irradiate the laser beam 2 with a high output of W0 to the melted region. Thus, the laser beam 2 can keep the melting state of the semiconductor film, which is melted by the pulsed laser beam 1. With these things considered, it is easily understood that not only the CW laser beam, but also the pulsed laser beam can be employed for the laser beam 2 because the oscillation system does not affect the essential quality of the present invention. FIG. 3B shows an example in which the pulsed laser beam is employed for the laser beam 2. In case of using the pulsed laser beam as the laser beam 2, it becomes possible to grow the crystal continuously when the pulsed laser beam having wavelengths absorbed sufficiently in the solid phase semiconductor film and the pulsed laser beam having wavelengths not absorbed sufficiently in the solid phase semiconductor film are irradiated alternately to make the energy absorbed in the semiconductor film constant (W0) at a rate per unit time. It is also important to make the energy constant in case of FIG. 3A.

In the above structure, the laser oscillator 1 is selected from the group consisting of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, and a gold vapor laser. These lasers are typical pulsed laser oscillators.

In the above structure, the laser oscillator 2 is selected from the group consisting of an Ar laser, a Kr laser, a $CO_2$ laser, a YAG laser, a $Y_2O_3$ laser, a $YVO_4$ laser, a YLF laser, a $YAlO_3$ laser, an alexandrite laser, a Ti:Sapphire laser and a helium-cadmium laser. These lasers are typical CW laser oscillators. However, even though these lasers are used as the pulsed laser oscillator, it does not have any influence on the essential quality of the present invention as described above. The output of the CW laser oscillator can be modulated and, such a CW laser oscillator as being capable of fine time modulation is in the market in case of a laser oscillator for welding such as a YAG laser.

In the above structure, the laser beam 1 is converted into a harmonic in order to make it visible light. The laser beam having the fundamental wave of visible light can be used as it is. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase conversion efficiency considerably.

In addition, it is preferable that the laser beam 1 is emitted with an oscillation mode of $TEM_{00}$ since it becomes possible to improve uniformity of energy of the obtained long beam. Moreover, a longer beam can be obtained because the laser beam can be converged so as to narrow its width further. This makes it possible to perform laser annealing more effectively.

When the annealing is performed to a semiconductor film formed over a substrate transparent to a laser beam, in order to realize uniform irradiation of the laser beam, it is desirable that an incidence angle $\phi$ of the laser beam satisfies the inequality of $\phi \geq \arctan(W/2d)$. In the inequality, it is defined that an incidence plane is perpendicular to the surface to be irradiated and is including a longer side or a shorter side of the laser beam spot assuming that a shape of the laser beam spot is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, many substrates have refractive indexes of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on the opposite sides and the value calculated in accordance with the inequality is enough to obtain the effect of attenuating the interference. The theory above is effective for the laser beam 1 and the laser beam 2, and it is preferable that both of them satisfy the inequality. In case of the laser oscillator having an extremely short coherence length such as an excimer laser, however, it does not cause any problems even though the inequality is not satisfied.

As the substrate, a glass substrate, a quartz substrate, a silicon substrate, a plastic substrate, a metal substrate, a stainless substrate, a flexible substrate, and the like can be used. As the glass substrate, a substrate of barium borosilicate glass or aluminum borosilicate glass can be given. Besides, the flexible substrate means a membranous substrate such as polyethylene terephthalate (PET), polyethersulfone (PES), polyethylene naphthalate, (PEN), acryl and the like, and weight saving is anticipated when the flexible substrate is used to manufacture a semiconductor device. It is desirable to form a barrier layer such as an aluminum film (for example, AlON, AlN, or AlO), a carbon film (such as a DLC (diamond-like carbon) film), or a SiN film in a single-layer structure or a multi-layer structure over a surface of the flexible substrate or over the surface and a rear surface thereof since the property such as durability is enhanced. The inequality with respect to $\phi$ is inapplicable to a substrate not transparent to the laser beam because the thickness of the substrate "d" becomes a meaningless value at all in this case.

The present invention provides a laser irradiation method comprising the steps of shaping a pulsed laser beam 1 having a wavelength not longer than that of visible light into a long beam on a surface to be irradiated, and moving the surface to be irradiated in a first direction relative to the long beam while irradiating a laser beam 2 having a fundamental wave simultaneously with the laser beam 1 so as to overlap with a region where the laser beam 1 is irradiated in the surface to be irradiated, wherein the energy of the laser beam 2 is modulated in synchronization with a period of a pulse oscillation of the pulsed laser beam 1.

In the above structure, the laser oscillator 1 is selected from the group consisting of an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, and a gold vapor laser. These lasers are typical pulsed laser oscillators.

In the above structure, the laser oscillator 2 is selected from the group consisting of an Ar laser, a Kr laser, a $CO_2$ laser, a YAG laser, a $Y_2O_3$ laser, a $YVO_4$ laser, a YLF laser, a $YAlO_3$ laser, an alexandrite laser, a Ti:Sapphire laser and a helium-cadmium laser. These lasers are typical CW laser oscillators. Even though these lasers are used as the pulsed laser oscillator, however, it does not have any influence on the essential quality of the present invention as described above.

In the above structure, the laser beam 1 is converted into a harmonic in order to make it visible light. The laser beam having the fundamental wave of visible light can be used as it is. As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to obtain considerably high conversion efficiency.

In addition, it is preferable that the laser beam 1 is emitted with an oscillation mode of $TEM_{00}$ since it becomes possible to improve uniformity of energy of the obtained long beam. Moreover, a longer beam can be obtained because the laser beam can be converged so as to narrow its width further. This makes it possible to perform laser annealing more effectively.

When the annealing is performed to a semiconductor film formed over a substrate transparent to a laser beam, in order to realize uniform irradiation of the laser beam, it is desirable that an incidence angle $\phi$ of the laser beam satisfies the inequality of $\phi \geq \arctan(W/2d)$. In the inequality, it is defined that an incidence plane is perpendicular to the surface to be irradiated and is including a longer side or a shorter side of the laser beam spot assuming that a shape of the laser beam spot is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, many substrates have refractive indexes of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on the opposite sides and the value calculated in accordance with the inequality is enough to obtain the effect of attenuating the interference. The theory above is effective for the laser beam 1 and the laser beam 2, and it is preferable that both of them satisfy the inequality. In case of the laser oscillator having an extremely short coherence length such as an excimer laser, however, it does not cause any problems though the inequality is not satisfied.

As the substrate, a glass substrate, a quartz substrate, a silicon substrate, a plastic substrate, a metal substrate, a stainless substrate, a flexible substrate, and the like can be used. The inequality with respect to $\phi$ is inapplicable to a substrate not transparent to the laser beam because the thickness of the substrate "d" becomes a meaningless value at all in this case.

The present invention provides a method for manufacturing a semiconductor device comprising the steps of forming a semiconductor film over a substrate, making the semiconductor film correspond with a surface to be irradiated by the laser beam, shaping a pulsed laser beam 1 having a wavelength not longer than that of visible light into a long beam on the surface to be irradiated, and moving the surface to be irradiated in a first direction relative to the long beam while irradiating a laser beam 2 having a fundamental wave simultaneously with the laser beam 1 so as to overlap with a region where the laser beam 1 is irradiated in the surface to be irradiated, wherein the energy of the laser beam 2 is modulated in synchronization with a period of a pulse oscillation of the pulsed laser beam 1.

In the above structure, the laser beam 1 is emitted from an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, or a gold vapor laser. These lasers are typical pulsed laser oscillators.

In the above structure, the laser beam 2 is emitted from an Ar laser, a Kr laser, a $CO_2$ laser, a YAG laser, a $Y_2O_3$ laser, a $YVO_4$ laser, a YLF laser, a $YAlO_3$ laser, an alexandrite laser, a Ti:Sapphire laser or a helium-cadmium laser. These lasers are typical CW laser oscillators. Even though these lasers are used as the pulsed laser oscillator, however, it does not have any influence on the essential quality of the present invention as described above.

In the above structure, the laser beam 1 is converted into a harmonic As a crystal used for the nonlinear optical element, crystals such as LBO, BBO, KDP, KTP, KB5, and CLBO are superior in terms of conversion efficiency. With the nonlinear optical element put in a resonator of the laser oscillator, it is possible to increase high conversion efficiency considerably.

In addition, it is preferable that the laser beam 1 is emitted with an oscillation mode of $TEM_{00}$ since it becomes possible to improve uniformity of energy of the obtained long beam and further to make the long beam much longer.

When the annealing is performed to a semiconductor film formed over a substrate transparent to a laser beam, in order to realize uniform irradiation of the laser beam, it is desirable that an incidence angle $\phi$ of the laser beam satisfies the inequality of $\phi \geq \arctan(W/2d)$. In the equality, it is defined that an incidence plane is perpendicular to the surface to be irradiated and is including a longer side or a shorter side of the laser beam spot assuming that a shape of the laser beam spot is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle $\phi$ when the track is not on the incidence plane. When the laser beam is made incident at an angle $\phi$, it is possible to perform uniform irradiation of the laser beam without interference of reflected light from a surface of the substrate with reflected light from a rear surface of the substrate. The theory above is considered assuming that a refractive index of the substrate is 1. In fact, many substrates have refractive indexes of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on opposite sides and the value calculated in accordance with the inequality is enough to obtain the effect of attenuating the interference. The theory above is effective for the laser beam 1 and the laser beam 2, and it is preferable that both of them satisfy the inequality. In case of the laser oscillator having an extremely short coherence length such as an excimer laser, however, it does not cause any problems though the inequality is not satisfied.

As the substrate, a glass substrate, a quartz substrate, a silicon substrate, a plastic substrate, a metal substrate, a stainless substrate, a flexible substrate, and the like can be used. The inequality with respect to $\phi$ is inapplicable to a substrate not transparent to the laser beam because the thickness of the substrate "d" becomes a meaningless value at all in this case.

The present invention offers the following basic advantages.

(a) Although the fundamental wave having a wavelength of about 1 μm is hardly absorbed in a normal thin semiconductor film, when there is an aid of the pulsed laser beam having a wavelength not longer than that of visible light irradiated simultaneously with the fundamental wave, the fundamental wave is absorbed sufficiently in the thin semiconductor film melted by the pulsed laser beam. Therefore, annealing efficiency to the semiconductor film is more enhanced. In the present invention, the wavelength of the fundamental wave is not limited to 1 μm approximately, and any other wavelengths are applicable as long as the wavelengths are absorbed in the melted semiconductor film. This makes it possible to assist the energy of the pulsed laser beam with the energy of the fundamental wave.

(b) When the fundamental wave having a wavelength of about 1 μm is irradiated simultaneously with the pulsed laser beam having a wavelength not longer than that of visible light to the semiconductor film, the fundamental wave is absorbed in the region melted by the pulsed laser beam in the semiconductor film, and the melting state can be kept even after the pulsed laser beam disappears once. On this occasion, it is preferable to increase the output of the fundamental wave appropriately in synchronization with the attenuation of the energy of the pulsed laser beam since the energy given to the semiconductor film can be made constant at a rate per unit time. When such a laser beam is scanned relative to the semiconductor film, it is possible to form the long crystal grain region because the melted region can be moved in the semiconductor film. Furthermore, since the energy given to the semiconductor film is constant at a rate per unit time, the semiconductor characteristic in the long crystal grain region can be made uniform. This is advantageous in enhancing the laser annealing efficiency and in relaxing the design rule because the long beam can be made much longer compared with the technique to employ only a CW laser beam having a wavelength not longer than that of visible light and having a small output. In the present invention, the wavelength of the fundamental wave is not limited to 1 μm approximately, and any other wavelengths are applicable as long as the wavelengths are absorbed in the melted semiconductor film.

(c) Unlike the harmonic, since the fundamental wave does not need the non-linear optical element to convert the laser beam, it is possible to obtain a laser beam having an extremely high output, which is 100 times or more than that of the harmonic for example. This is because the non-linear optical element has a very low resistance against the laser beam. In addition, the non-linear optical element to generate the harmonic has such a disadvantage as a maintenance-free state, which is an advantage of the solid laser, cannot be kept long because the non-linear optical element is easy to change in quality. Therefore, it is very effective to use the pulsed laser beam having a wavelength not longer than that of visible light and to keep irradiating the fundamental wave while the pulsed laser beam disappears, because it is possible to form the long crystal grain region conventionally obtained with the CW laser beam having a small output and having the wavelength not longer than that of visible light similarly and furthermore, it is possible to form the long crystal grain region having a large size at once.

(d) Uniform annealing to the object to be irradiated becomes possible. Especially the present invention is suitable for crystallizing the semiconductor film, enhancing the crystallinity and activating the impurities.

(e) With these advantages satisfied, the operating characteristic and the reliability of the semiconductor device, typically the active matrix liquid crystal display device, can be enhanced. Moreover, the cost for manufacturing the semiconductor device can be reduced

DETAILED DESCRIPTION OF THE PREFERRED EMBODIMENTS

Embodiment Mode 1

Figure 1:
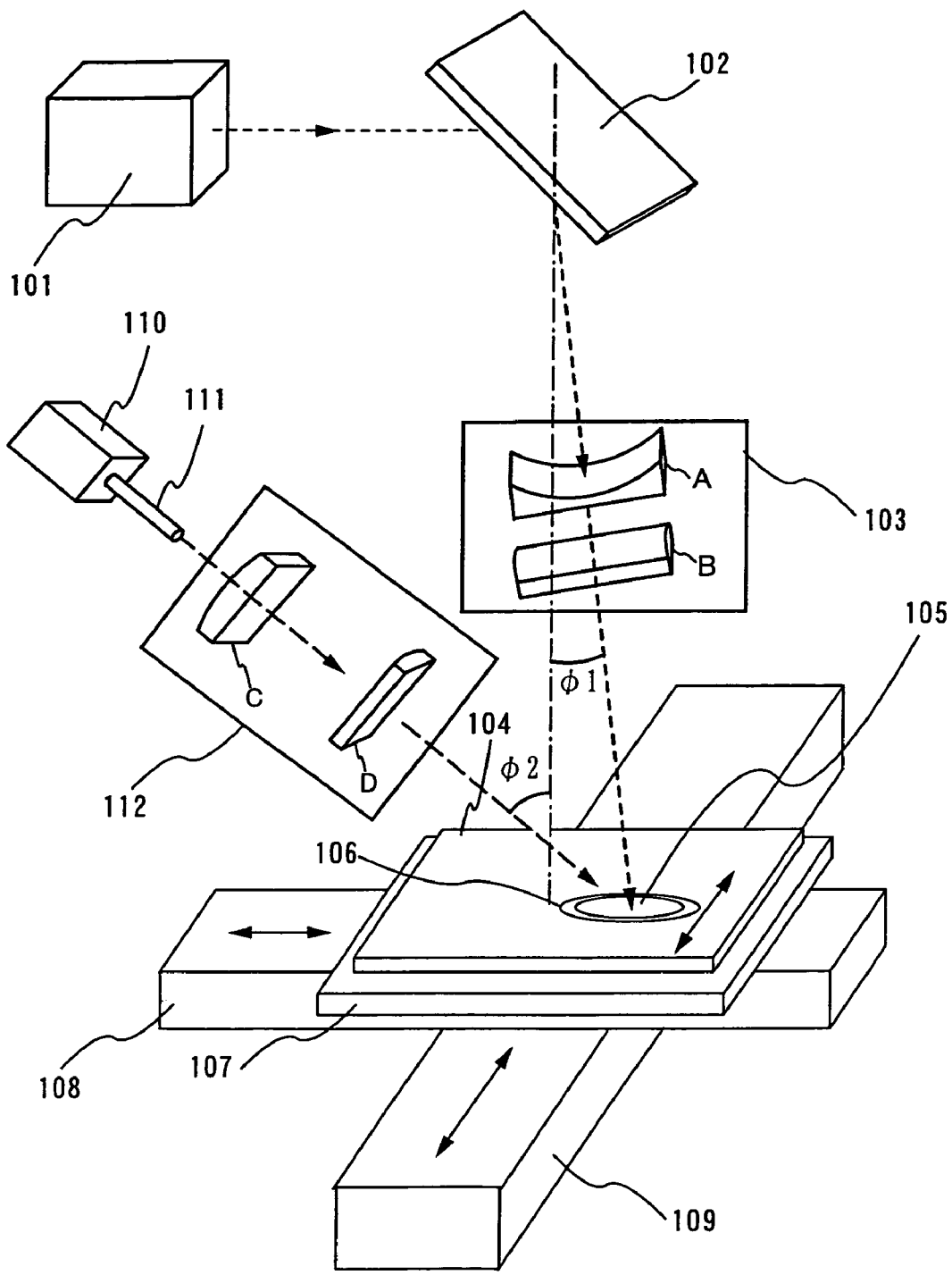
FIG. 1 is a drawing to explain an embodiment mode 1.

An embodiment mode of the present invention is explained with FIG. 1. This embodiment mode explains an example in which a long beam 105 and a long beam 106 are formed to irradiate a surface of a semiconductor film 104.

First, a pulsed laser oscillator 101 with an output of 10 W (Nd:YLF laser, second harmonic) is prepared. The laser oscillator generates in $TEM_{00}$ mode, and includes a non-linear optical element to convert a laser beam into the second harmonic. The harmonic is not particularly limited to the second harmonic, but the second harmonic is superior to the other higher harmonics in terms of conversion efficiency. The frequency is 1 kHz, and the pulse width is 60 ns approximately. Although a compact solid laser is used in this embodiment mode, a large-scale laser with an output as much as 300 W such as a XeCl excimer laser may be also used.

Since the laser beam is usually emitted to the horizontal direction, a traveling direction of the laser beam 1 is changed so as to have an angle φ from the vertical direction with a 45° reflecting mirror 102. In this embodiment mode, φ1=21°. Next, a shape of the beam spot of the laser beam 1 is changed through an optical system 103. The traveling direction of the laser beam 1 is defined as the optical axis, and a planoconcave cylindrical lens A having a radius of curvature of 10 mm and having a thickness of 2 mm is arranged in the position 29 mm from a surface to be irradiated 104 along the optical axis. The generating line of the planoconcave cylindrical lens A and an incidence plane of the laser beam 1 which is incident into the surface to be irradiated 104 are made perpendicular. Next, a planoconvex cylindrical lens B having a radius of curvature of 15 mm and having a thickness of 2 mm is arranged in the position 24 mm from the surface to be irradiated 104 along the optical axis. The generating line of the planoconvex cylindrical lens B is made parallel to the incidence plane. This makes a long beam 1 (106) having a size of 3 mm×0.2 mm formed on the surface to be irradiated 104.

Next, a CW laser oscillator 110 with an output of 2 kW (Nd:YAG laser, fundamental wave) is prepared. An optical fiber 111 of φ 300 μm is arranged in such a way that the exit of the optical fiber is in the direction at an angle 45° (=φ2) from the vertical direction and that the direction of the exit leads to the center of the long beam 1. In addition, the exit is disposed in the position 105 mm from the surface to be irradiated 104 along the optical axis 2 of the laser beam 2 emitted from the laser oscillator 110, and the optical axis 2 is made to be included in the incidence plane. Then the shape of the beam spot of the laser beam 2 is changed through an optical system 112. Moreover a planoconvex cylindrical lens C having a radius of curvature of 15 mm and having a thickness of 4 mm is disposed in the position 85 mm from the surface to be irradiated 104 along the optical axis 2. The direction of the generating line of the planoconvex cylindrical lens C is made perpendicular to the incidence plane. Moreover, a planoconvex cylindrical lens D having a radius of curvature of 10 mm, and a thickness of 2 mm is disposed in the position 25 mm from the surface to be irradiated 104 along the optical axis 2. The generating line of the planoconvex cylindrical lens D is made parallel to the incidence plane. This makes a long beam 2 (105) having a size of 3 mm×0.1 mm formed on the surface to be irradiated 104. A semiconductor film is set on the surface to be irradiated 104 and is made parallel to the horizontal plane. The semiconductor film is formed over a glass substrate, for example. The substrate with a semiconductor film formed thereon is the glass substrate having a thickness of 0.7 mm in this embodiment mode, and is fixed on the vacuum suction stage 107 so as not to fall in the laser irradiation. The vacuum suction stage 107 can be operated in XY directions in the plane parallel to the surface of the semiconductor film 104 with a uniaxial robot for X-axis 108 and a uniaxial robot for Y-axis 109. Usually the glass substrate is transparent to the fundamental wave having a wavelength of 1 μm approximately and to the second harmonic of green color. In order for the present optical system to satisfy the above inequality, the positions of the planoconvex cylindrical lens B and the planoconvex cylindrical lens D are displaced in the direction perpendicular to the incidence plane so as to have an incidence angle in the plane which is including a minor axis of the long beam and which is perpendicular to the surface to be irradiated 104. In such a case, when the long beam 1 has an incidence angle of about 10°, and the long beam 2 has an incidence angle of about 5°, interference does not occur.

Figure 3A:
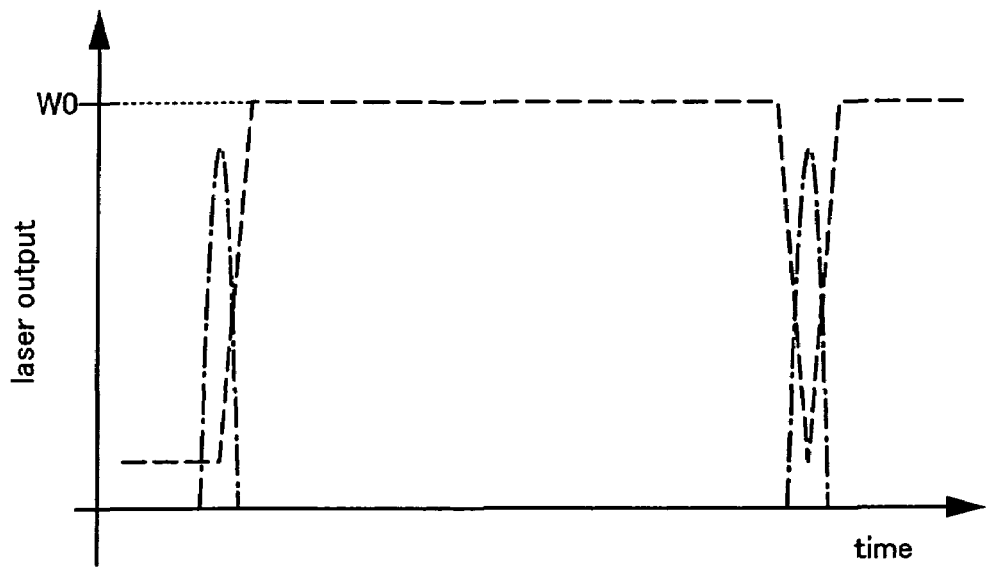
FIGS. 3A and 3B are drawings to explain a change of the output of the laser oscillator according to time.

Next, a method to modulate the CW laser oscillator 110 is explained. The timing for modulation is as explained with FIGS. 3A and 3B. First, the semiconductor film is melted with the laser beam emitted from the pulsed laser oscillator 101. And then, while the melting state is kept, the output of the laser beam emitted from the CW laser oscillator 110 is modulated to increase the output so as to keep the melting state of the semiconductor film. The output necessary to keep the melting state is influenced by the physicality of the semiconductor film, the scanning speed of the laser beam and the like. However, when the output is in the range from 50 kW/cm$^2$ to 500 MW/cm$^2$, there is a high possibility to be able to select the appropriate energy. Although the output from the CW laser oscillator 110 may be modulated to be like a pulse oscillation, it is preferable that the CW laser oscillator 110 is oscillated continuously as keeping an output more than a certain degree rather than decreasing the output from the CW laser oscillator 110 to zero completely in order to make up for the output of the pulsed laser oscillator 101. This makes a width of a long crystal grain region obtained by the pulsed laser oscillator with the CW laser oscillator become broader than that obtained by only the pulsed laser oscillator. Therefore, the apparatus with high throughput can be offered. FIG. 3A explains this description. In FIG. 3A, when the optimum output of the laser beam in the present process is assumed to be W0, the output from the pulsed laser oscillator is made less than W0, and the energy is compensated with the output from the CW laser oscillator so that the total output becomes W0. When the output from the pulsed laser oscillator begins to be attenuated, the output of the CW laser oscillator is increased. It is appropriate that the output of the CW laser oscillator reaches W0 when the output from the pulsed laser oscillator disappears. Such round of operation can crystallize the semiconductor film as keeping the width of the long crystal grain region broad. It is noted that the modulation is performed by modulating the Q-value of the CW laser oscillator or by dividing the traveling direction of the laser beam into two directions with the acousto-optic element to change the balance of the output of the zero-order light and the first-order light.

Next, an example of a method for manufacturing a semiconductor film is explained. The semiconductor film is formed over a glass substrate. Specifically, a silicon oxynitride film is formed in 200 nm thick over one side of the glass substrate having a thickness of 0.7 mm and an amorphous silicon film is formed in 70 nm thick thereon with plasma CVD. Moreover, in order to grow the resistance of the semiconductor film against the laser beam, thermal annealing is performed to the semiconductor film at a temperature of 500° C. for an hour. Instead of the thermal annealing, the semiconductor film may be crystallized with the metal element as described in the related art. In any case, the optimum condition for irradiating the laser beam to the semiconductor film is almost the same.

Next, an example in which the laser beam is irradiated to the semiconductor film (that is the surface to be irradiated 104) is explained. The substrate with the semiconductor film formed thereon is scanned in the direction of the minor axis of the long beam 105 with the robot for Y-axis 109 so as to fill the region having a width from 1 mm to 2 mm in the direction of the major axis of the long beam 105 with a plurality of single crystals extending long in the scanning direction. The region is referred to as the long crystal grain region in this specification. In such a case, the output of the laser oscillator is modulated in accordance with the pattern shown in FIG. 3A or 3B. When the substrate is scanned, the second harmonic is irradiated to melt the semiconductor film. Since the fundamental wave acts upon the melted region in the semiconductor film, the melted region is kept even after the pulsed laser beam of the second harmonic disappears. The melted region is moved in one direction with the scanning and thus a single crystal extending long in the scanning direction is formed. After that, the next pulsed laser beam (the second harmonic) is irradiated and the energy is compensated before the melting state disappears. The scanning speed is appropriate between several cm/s and several hundreds cm/s, and here it is set to 50 cm/s.

Figure 6:
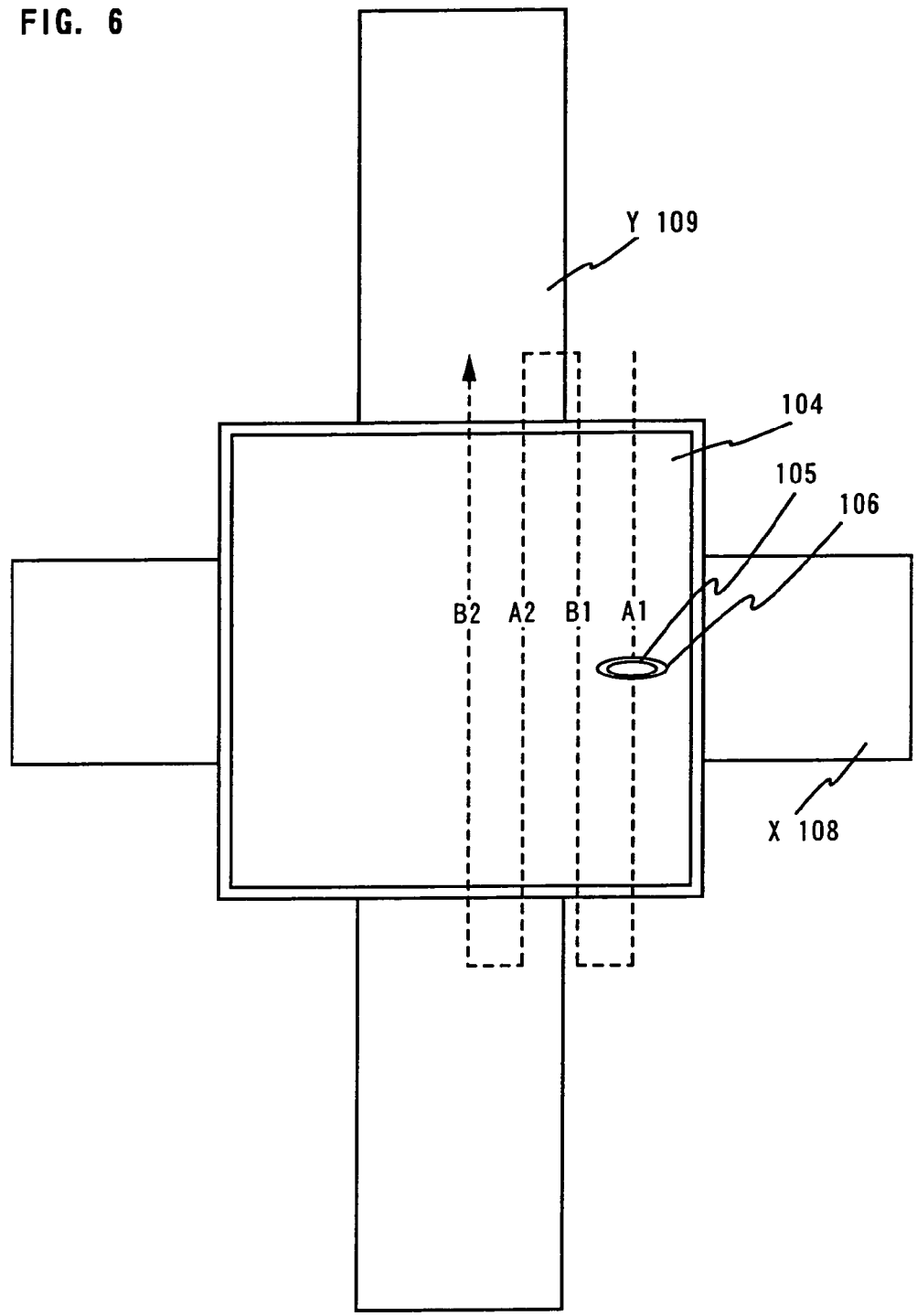
FIG. 6 is a drawing to show an example of laser irradiation to the whole surface of the semiconductor film.

An irradiation method to make the whole surface of the semiconductor film become the long crystal grain region is explained with FIG. 6. In order to make it easier to understand, the same reference number as that in FIG. 1 is used in FIG. 6. The substrate with the semiconductor film formed thereon is fixed on the vacuum suction stage 107 and the laser oscillator 101 and the laser oscillator 110 are oscillated. First, the uniaxial robot for Y-axis 109 is used to scan the surface of the semiconductor film in a straight line at a scanning speed of 50 cm/s. The straight line corresponds to a portion of "A1" in FIG. 6. In FIG. 6, after the laser beam is irradiated to an outward portion "Am" (m is a positive integer) with the uniaxial robot for Y-axis 109, the uniaxial robot for X-axis 108 is used to shift the long beam in the direction of the major axis thereof by the width of the long crystal grain region, and the laser beam is irradiated to a homeward portion "Bm". However, a region having the insufficient energy is formed in opposite ends of the long crystal grain region in its width direction. Such a region is occupied with the conventional poly-crystals as crystallized with an excimer laser. Therefore, it is preferable to overlap such a region in the outward and homeward scanning since the usability of the semiconductor film can be highly improved. In addition, it is important not to form the semiconductor element requiring superior characteristics in such a region. Such round of operation is repeated in order to form the long crystal grain region over the whole surface of the semiconductor film. It is noted that the semiconductor film comprising the long crystal grain region has quite superior characteristics. In particular, in the case of manufacturing a semiconductor device such as TFT in the long crystal grain region, the semiconductor device can be expected to show quite high electrical mobility. Conversely, it is unnecessary to form the long crystal grain region in a portion of the semiconductor film not requiring such superior characteristics. Therefore, the laser beam may not be irradiated to such a portion, or irradiation may be performed so as not to form the long crystal grain region. In order to anneal the semiconductor film efficiently not to form the long crystal grain region, the scanning speed may be increased, for example. When the scanning speed is 2 m/s approximately, the amorphous silicon film can be crystallized without forming the long crystal grain region, and what is called a poly-silicon film is formed. It is obvious that the scanning speed depends on the object to be irradiated, but the scanning speed above is basically an appropriate value to the film whose manufacturing process is explained in this embodiment mode. A semiconductor device is manufactured by the known method with the semiconductor film obtained with the above process. An example of the method for manufacturing the semiconductor device is described in the following embodiment.

Embodiment Mode 2

Figure 2A:
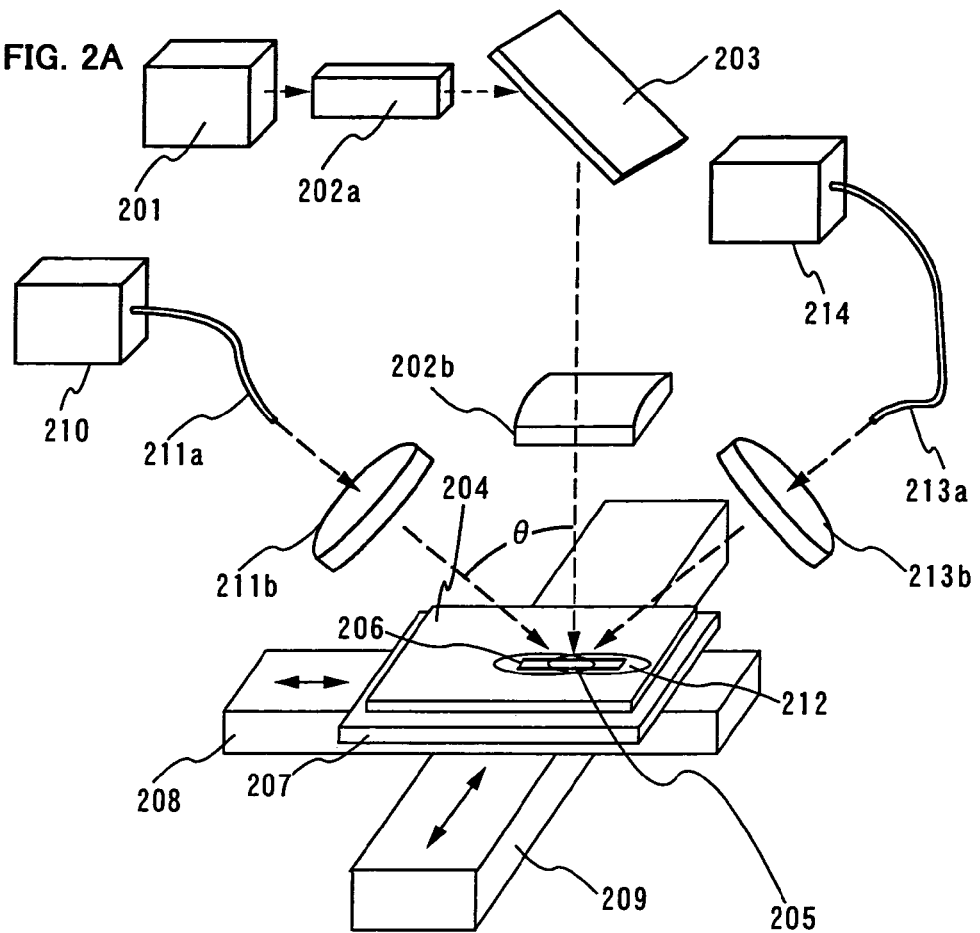
FIGS. 2A to 2C are drawings to explain an embodiment mode 2.
Figure 2B:
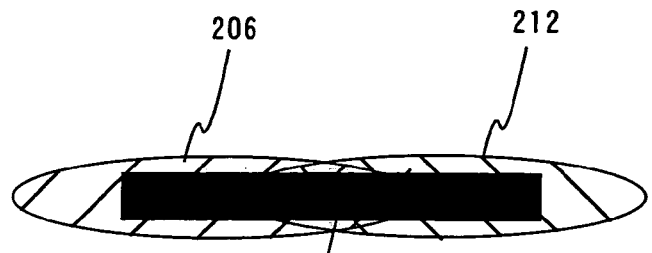

This embodiment mode explains with FIGS. 2A and 2B an example in which the long beam obtained by shaping the second harmonic shown in the embodiment mode 1 is made much longer by using a plurality of laser oscillators outputting fundamental waves.

First, a pulsed laser oscillator 201 with an output of 30 W (KrF excimer laser, wavelength of 248 nm) is prepared. The pulsed laser oscillator has a frequency of 100 Hz, and can output 300 mJ per a pulse. The beam spot is processed to have a size of 2 mm×1 mm through an appropriate optical systems 202a and 202b. The beam is reflected by a mirror 203 between the optical systems 202a and 202b. The energy distribution is made uniform, and a homogenizer with a cylindrical lens array and a cylindrical lens combined for example, is used as the optical system. Alternatively, a light pipe or other integrated lens may be used in order to homogenize the energy distribution. When the semiconductor film is crystallized with an excimer laser, the optimum energy density is basically in the range from 200 mJ/cm$^2$ to 1000 mJ/cm$^2$. Therefore, the beam spot having the above size is not appropriate because the energy density becomes 15000 mJ/cm$^2$ approximately. In such a case, an ND filter or a beam splitter is used to attenuate the energy in order to obtain the appropriate energy density. When the laser beam having too high energy density is irradiated to the ND filter, however, there is a risk that the filter is broken. Therefore, it is preferable to attenuate the energy with the beam splitter and the like that hardly absorb the heat for the sake of safety. It is advisable to absorb with a damper or the like the unnecessary beam that is separated with the beam splitter in order to enhance the safety. It is noted that in case of the excimer laser, the angle of the laser beam incident into the semiconductor film does not need to be cared since the coherence length thereof is very short.

Next, a laser oscillator 210 and a laser oscillator 214 (Nd: YAG laser, CW, fundamental wave (1.064 µm)), both having an output of 2000 W are prepared. It is preferable to employ LD pumped laser oscillators as these laser oscillators 210 and 214 since the LD pumped laser oscillator is superior because of its long service life and its easy maintenance. Laser beams emitted from these laser oscillators are transmitted through step index optical fibers 211a and 213a, having a diameter of 1 mm respectively. After the laser beams are emitted from the optical fibers, the laser beams are shaped into circular having a diameter of 1 mm through converging lenses 211b and 213b each having a magnification of 1 respectively. It is preferable to make the circular laser beams incident into the semiconductor film at an angle of 55° or more in order to prevent the interference. In this embodiment mode, the incidence angle is set to 55°, and the circular beams 206 and 212 each having a size of about 15 mm×1 mm are formed on the semiconductor film. The laser beam becomes elliptical because the incidence angle is more than 0°. The circular beams 206 and 212 are disposed so as to cover the long beam 205.

Figure 2C:
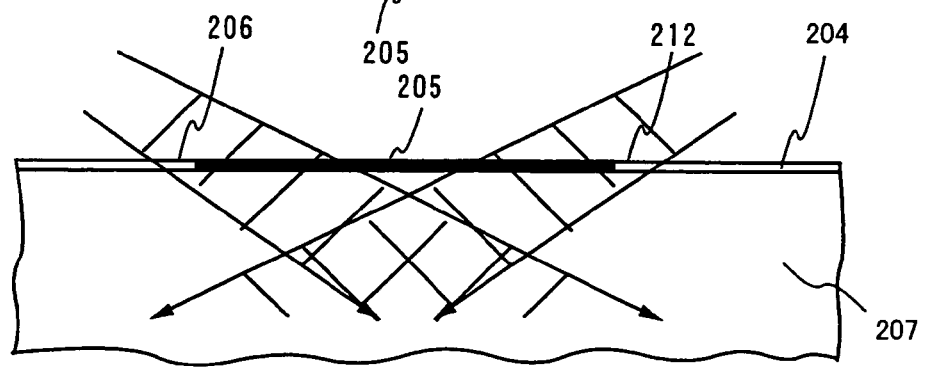

The laser beams are arranged in the same manner as shown in FIGS. 2B and 2C, for example, and the elliptical beams 206 and 212 of the fundamental wave are disposed on the opposite ends of the long beam 205 formed with the second harmonic in the direction of major axis thereof in such a way that the major axes of the elliptical beams are arranged in a straight line. FIG. 2B is a side view and FIG. 2C is a top view. When the distance between the two elliptical beams is adjusted appropriately, the energy distribution of the laser beam having the fundamental wave can be made uniform. That is to say, the laser beam usually has Gaussian energy distribution where the energy is the highest in the center of the beam spot and is attenuated toward the end portion thereof. Therefore, the elliptical beams 206 and 212 also have low energy in the end portions thereof compared with the energy in the center thereof, which affects the uniformity of the laser annealing. Therefore, when the two elliptical beams are disposed so as to compensate the attenuation of the energy, it becomes possible to obtain the region having a comparatively uniform energy distribution over the region where the two elliptical beams are overlapped and its vicinity.

The laser irradiation is performed to the semiconductor film after disposing the optical system as explained above. The laser irradiation method is as described in the embodiment mode 1. In this embodiment mode, both of the energy distribution of the pulsed laser beam and that of the fundamental wave are comparatively uniform in the melted region of the semiconductor film, and thereby this embodiment mode is particularly effective for the semiconductor device requiring more uniform characteristic of the semiconductor element. In case to make the laser beam of the fundamental wave have more uniform energy distribution on the semiconductor film, a kaleidoscope and the like are used as the optical system to form a rectangular beam, not an elliptical beam, on the semiconductor film, and then the laser irradiation may be performed according to the laser irradiation method shown in this embodiment mode. This makes it possible to keep irradiating the laser beam having a comparatively uniform energy distribution (fundamental wave) to the semiconductor film even after the long beam 205 having a uniform energy distribution disappears.

Figure 3B:
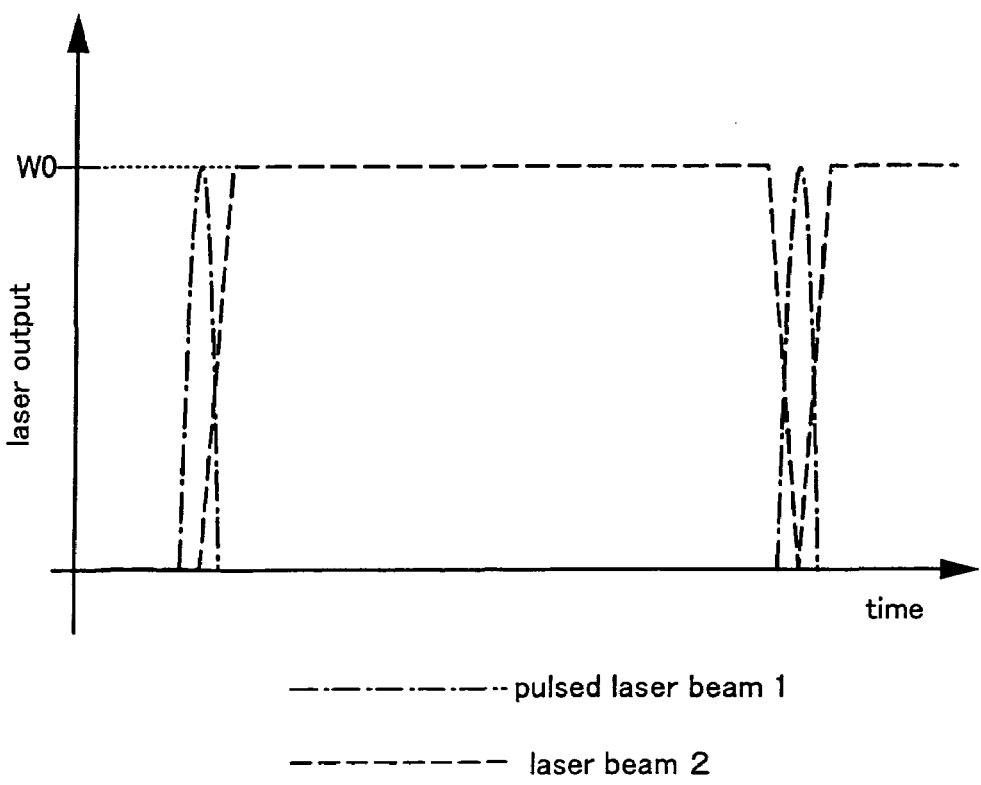

Next, an example of the laser irradiation to the semiconductor film 204 is explained. The semiconductor film 204 is manufactured with the method described in the embodiment mode 1, for example. The substrate 207 with the semiconductor film 204 formed thereon is scanned in the direction of the minor axis of the long beam 205 with the uniaxial robot for Y-axis 209 and moreover, the output of the laser oscillators 210 and 214 is modulated as shown in FIGS. 3A and 3B so as to form a plurality of single-crystal grains extending long in the scanning direction in a packed state in the region having a width of 2 mm in the direction of the major axis of the long beam 205. When the substrate is scanned, the semiconductor film is irradiated with the fundamental wave first, and then with the second harmonic, and at last with the fundamental wave again. This makes it possible to prevent the semiconductor film 204 from changing in temperature suddenly. The laser beam here is made incident at an angle of 55° or more, which prevents the interference in order to make it possible to irradiate the laser beam more uniformly. Without the aid of the elliptical beams 206 and 212 of the fundamental wave, the long crystal grain region cannot be formed. With the aid thereof, however, the fundamental wave keeps to be irradiated to the semiconductor film continuously between the pulses, and thereby the long crystal grain region is formed in 2 mm width approximately. This is about ten times as broad as the width of the long crystal grain region that can be formed with one CW laser oscillator of visible light.

According to the above process, although the region having uniform energy distribution is broadened, the part of the laser beam having low energy is still irradiated to opposite ends in the width direction of the long crystal grain region, and thereby the characteristic deterioration in the semiconductor element manufactured in such a portion is concerned. Therefore, it is better not to manufacture a semiconductor element in such a portion. Alternatively, the portion where the characteristic deterioration is concerned may be eliminated by scanning in such a way that the long beam is overlapped in the direction of its major axis. For example, when the region in which the characteristic deterioration is concerned in the long crystal grain region having a width of 2 mm is assumed to be 30 μm in opposite ends respectively, the width of the long crystal grain region that can be used efficiently is 1940 μm. Therefore, after crystallizing the semiconductor film 204 with the scanning in one direction by the robot for Y-axis 209, the robot for X-axis 208 is moved for 1940 μm, and then the robot for Y-axis 209 is scanned again to form the long crystal grain region. By repeating such scanning, it is possible to form the region having a good characteristic so as to cover the region in which the characteristic might deteriorate. However, once the region in which the characteristic might deteriorate is formed, such a region has a considerably different semiconductor characteristic. When it is not preferable to form the semiconductor element in the region where the characteristic might deteriorate, the robot for X-axis is moved by 1970 μm in order to overlap the regions in which the characteristic might deteriorate with the adjacent scanning. Thus, it becomes possible to minimize the loss of the semiconductor film. Moreover, in such a case, is becomes possible to form the semiconductor film that can be used effectively in 1940 μm wide, and to form the region that cannot be used in 30 μm wide alternately. In order to crystallize the whole surface or a part of the surface of the semiconductor film 204, it is advisable to follow the explanation described in the embodiment mode 1 using FIG. 6. With the above method, the semiconductor device can be manufactured with the obtained semiconductor film by the known method. The following embodiment will explain the method for manufacturing the semiconductor device.

Embodiment Mode 3

Figures 4A, 4B:
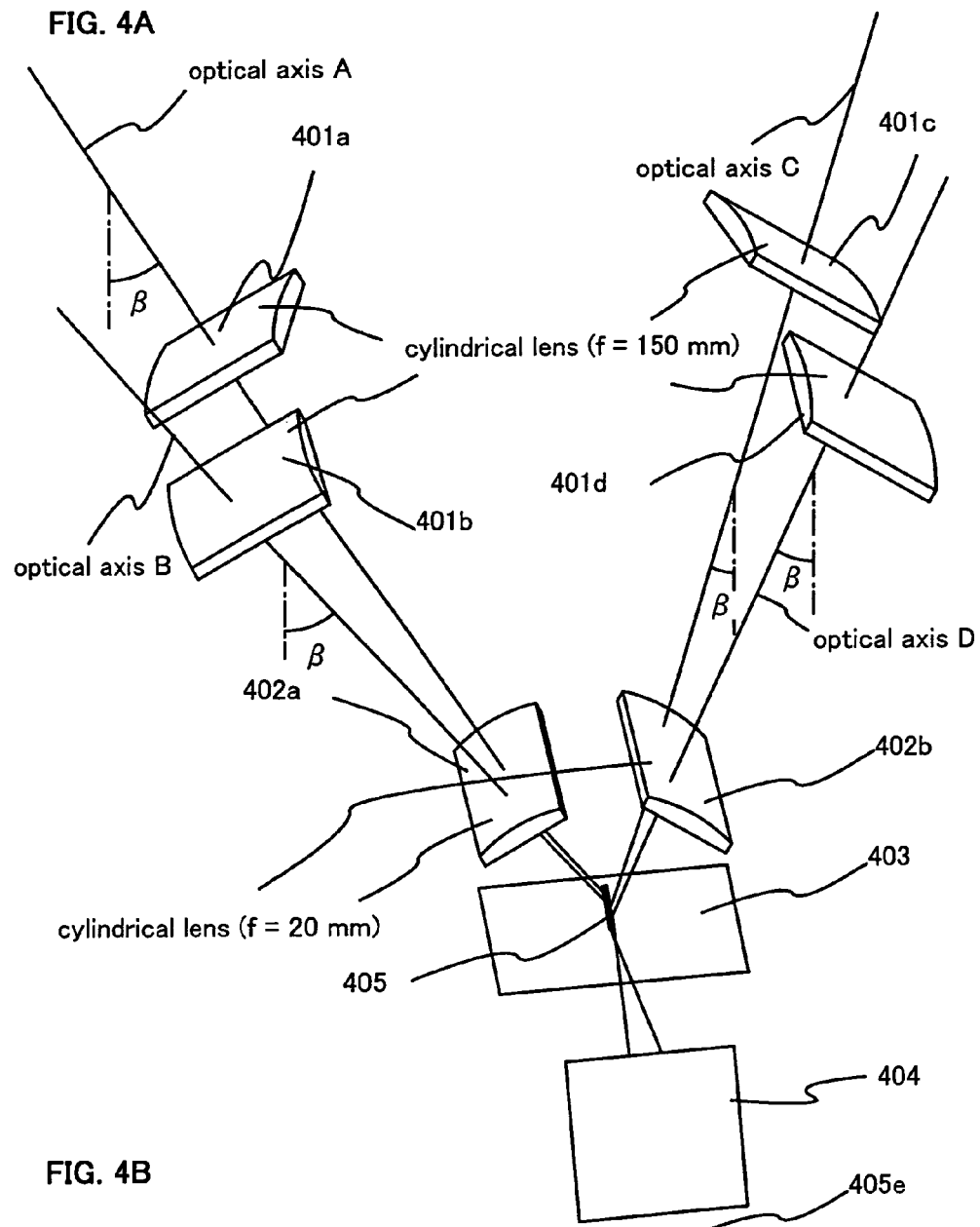
FIGS. 4A and 4B are drawings to explain an embodiment mode 3.

This embodiment mode explains an example with FIGS. 4A and 4B in which several long laser beams obtained by shaping the second harmonic are combined to form a much longer beam, and furthermore the fundamental wave is used to aid the energy.

First, four pulsed laser oscillators with an output of 6 W respectively (Nd:YLF laser, second harmonic) are prepared (not shown in the figure). Each of the laser oscillators generates in $TEM_{00}$ mode and includes a non-linear optical element to convert the laser beam into the second harmonic. The harmonic is not limited to the second harmonic, but the second harmonic is superior to the other higher harmonics in terms of conversion efficiency. The frequency is 1 kHz, and the pulse width is 60 ns approximately. Although a compact solid laser is used in this embodiment mode, a large-scale laser with an output as much as 300 W such as a XeCl excimer laser may be also employed.

Several reflecting mirrors are used in order to change traveling directions of the laser beams respectively so as to have an angle β to the vertical direction, and the laser beams are made incident into a to be irradiated 403 from four directions so as to be combined into nearly one on the surface to be irradiated. The four directions are corresponded to optical axes A, B, C, and D respectively. The optical axes A and B (also the optical axes C and D) are positioned plane-symmetrically to plane A that is perpendicular to the surface to be irradiated, and an angle made by the optical axes A and B (also an angle made by the optical axes C and D) is set to 20°. In addition, the optical axes A and C (also the optical axes B and D) are positioned plane-symmetrically to plane B that is perpendicular to the plane A and the surface to be irradiated, and an angle made by plane C including the optical axes A and B, and plane D including the optical axes C and D is set to 50°.

Then, planoconvex cylindrical lenses 401a, 401b, 401c, and 401d each having a focal length of 150 mm are arranged so that the optical axes A, B, C, and D are incident at an angle of 0° respectively. On this occasion, condensing directions of the planoconvex cylindrical lenses are the directions included in the plane C or plane D. A distance between the surface to be irradiated and each of the planoconvex cylindrical lenses 401a to 401d is adjusted between 180 mm to 300 mm when measured along the optical axes respectively.

Further, planoconvex cylindrical lenses 402a and 402b each having a focal length of 20 mm are arranged so that their generating lines are included in the planes C and D respectively. The generating line described here is defined as a generating line located at a curved portion of the cylindrical lens, which is the farthest from the plane portion of the cylindrical lens. The plane portion of the planoconvex cylindrical lens 402a and the plane C are orthogonalized each other, and the plane portion of the planoconvex cylindrical lens 402b and the plane D are orthogonalized each other. A distance between the surface to be irradiated and each of the planoconvex cylindrical lenses 402a and 402b is adjusted to be 18 mm approximately when measured along the optical axes respectively.

With the arrangement described above, four long beams each having a length of 1 mm in a major axis and having a length of 600 μm in a minor axis are formed on the surface to be irradiated 403 (the assemblage of the four long beams are designated as 405). When nothing is done, the four long beams are combined into one perfectly on the surface to be irradiated without forming a longer beam. However, when the positions of the respective lenses are fine adjusted, the arrangement of the four long beams is changed as shown in FIG. 4B. That is to say, the major axes of the four elliptical beams 405*a* to 405*d* forming the assemblage 405 are arranged in a straight line and shifted each other in the direction of their major axes to form a longer beam from the four elliptical beams. In this way, a region having a uniform energy distribution with a width of 3 mm can be obtained. The four pulsed laser beams are irradiated in synchronization with each other by a common frequency and pulse timing so as to be irradiated simultaneously.

Then, an LD pumped CW YAG laser (fundamental wave) with an output of 2000 W is used to form a rectangular beam 405*e* having a size of 3.0 mm×0.3 mm on the surface to be irradiated with an optical system 404. On this occasion, the rectangular beam 405*e* is formed so as to cover the four long beams 405*a* to 405*d*. As the optical system 404, for example the kaleidoscope may be employed in combination with a converging lens. Since the fundamental wave is reflected somewhat on a surface of a semiconductor film, the laser beam must not be made incident vertically into the surface to be irradiated.

Thus formed long beam may be employed to crystallize the whole surface of the semiconductor film with a uniaxial robot for X-axis 108 and a uniaxial robot for Y-axis 109 shown in the embodiment mode 1. On this occasion, the fundamental wave is modulated in synchronization with the pulse oscillation of the pulse laser oscillator as shown in FIG. 3A or 3B. The semiconductor film may be manufactured with the process shown in the embodiment mode 1. The present embodiment mode gives advantages that the longer beam can shorten processing time and that the energy distribution is homogenized in the direction of its major axis because the elliptical beams 405*a* to 405*d* with Gaussian energy distribution are overlapped each other contiguously, which makes it possible to suppress the variation in temperature comparatively. The semiconductor device is manufactured with the semiconductor film obtained with the above process by the known method. The method for manufacturing the semiconductor device is explained in the following embodiment.

Embodiment Mode 4

Figure 5:
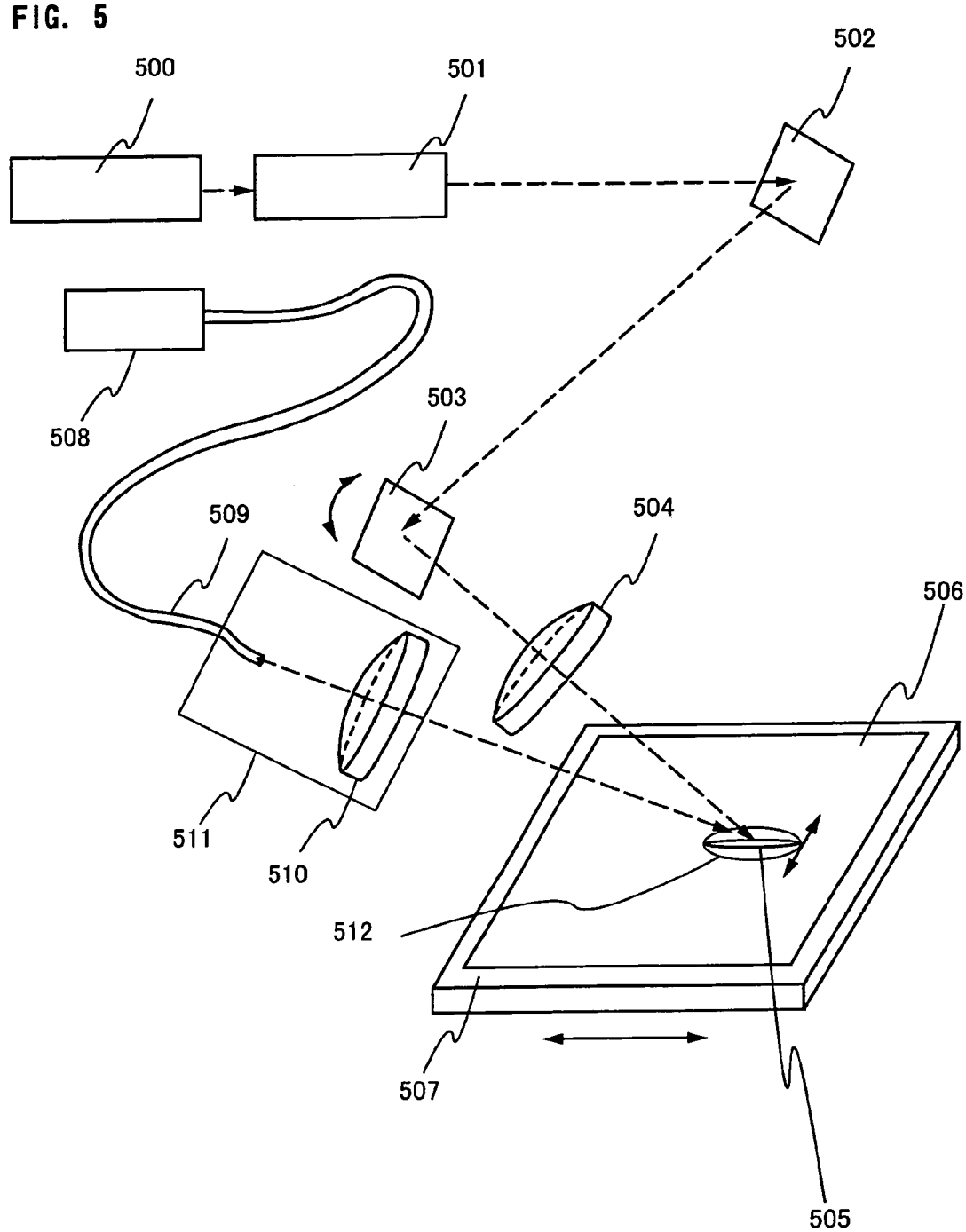
FIG. 5 is a drawing to explain an embodiment mode 4.

This embodiment explains an example with FIG. 5 in which the long beam obtained by shaping the second harmonic is irradiated with deflecting means such as a galvanometer mirror, and in addition, the fundamental wave is irradiated with deflecting means such as a galvanometer mirror in order to aid the energy.

First, a pulsed laser oscillator 500 with an output of 6 W (Nd:YLF laser, second harmonic) is prepared. The laser oscillator generates a laser beam in $TEM_{00}$ mode and the laser beam is converted into the second harmonic by the non-linear optical element. The harmonic is not limited to the second harmonic, but the second harmonic is superior to the other higher harmonics in terms of conversion efficiency. The frequency is 1 kHz, and the pulse width is 60 ns approximately. Although a compact solid laser is used in this embodiment mode, a large-scale laser with an output as much as 300 W such as a XeCl excimer laser may be also employed. Since this beam is circular, it is made incident into an optical system 501 in order to shape it into oblong. A beam expander including two cylindrical lenses may be used as the shaping means, and the beam may be extended only in one direction to shape it into elliptical. Alternatively, a beam expander comprising a general spherical lens may be combined with the above beam expander in order to control the divergence angle. Next, the traveling direction of the laser beam shaped into elliptical is changed by a mirror 502. Then the elliptical beam is deflected by a galvanometer mirror 503. The deflected laser beam reaches a plane formed on a semiconductor film 506 through an fθ lens 504. The elliptical laser beam is converged on the plane through the fθ lens 504. This makes a long beam 505 having a length of 200 μm in a minor axis and having a length of 3 mm in a major axis formed on the plane. The long beam 505 is scanned on the plane in the direction shown by an arrow in the figure by changing an angle of the galvanometer mirror 503. The fθ lens 504 can prevent a shape of the long beam 505 from changing due to the angle of the galvanometer mirror. The incidence angle of the laser beam to the semiconductor film 506 is set to 65°. This can prevent the interference between the reflected light from the surface of the semiconductor film 506 and the reflected light from the rear surface of the substrate with the semiconductor film 506 formed thereon from occurring on the semiconductor film. In this embodiment mode, the galvanometer mirror 503 includes one mirror, and thereby the substrate is scanned only in one direction. Since the whole two-dimensional plane cannot be scanned with the galvanometer mirror 503, the substrate is mounted on a uniaxial stage 507 that is operated in right-and-left direction on paper in FIG. 5 so that the whole surface of the substrate can be annealed. The scanning speed of the long beam 505 ranges from 100 mm/s to 2000 mm/s, and preferably is 500 mm/s approximately.

In order to irradiate the fundamental wave to the semiconductor film 506 in accordance with the long beam 505 formed with the second harmonic, an LD pumped YAG laser 508 with an output of 2000 W is employed. The laser beam emitted from the YAG laser transmits through a step index optical fiber 509 of ϕ1 mm (diameter is 1 mm) so as to make the energy distribution of the laser beam uniform. The emitting light from the optical fiber 509 is converged with a converging lens 510 having a magnification of 1, and is made incident into the semiconductor film at an angle of 70°. This forms an elliptical beam 512 having a size of 1 mm×3 mm approximately on the semiconductor film. The elliptical beam 512 needs to be scanned in synchronization with the operation of the long beam 505. As far as the present method, an optical system 511 may be formed by unitizing the optical fiber 509 and the converging lens 510 and then the optical system 511 is set on a rail not shown in the figure so that the optical system 511 moves in right-and-left direction on the rail. This is feasible because the optical fiber 509 is flexible. Alternatively, the scanning may be performed with the galvanometer mirror or the polygon mirror in the same manner as the scanning of the second harmonic.

In order to anneal the whole surface of the semiconductor film 506, the following operation may be performed repeatedly, for example. After the optical system 511 is operated in one direction in synchronization with the operation of the galvanometer mirrors 503 in a half cycle, the uniaxial stage 507 is moved by the width of the long crystal grain region, and then the optical system 511 is operated in one direction in synchronization with the operation of the galvanometer mirror 503 in a half cycle again. On this occasion, it is necessary to prepare an operation system with high controllability in order for the long beam 505 and the elliptical beam 512 not to be separated on the surface to be irradiated. In this embodiment mode, the long crystal grain region has a width of 3 mm approximately and the uniaxial stage 507 is moved by its width sequentially. The semiconductor device is manufactured with the semiconductor film obtained through the above process by the known method. The method for manufacturing the semiconductor device will be explained in the following embodiment.

Embodiment 1

This embodiment explains with FIGS. 7A to 8C an example of the method for manufacturing an active matrix substrate with the semiconductor film whose manufacturing method is already explained in the embodiment mode.

First of all, a substrate 700 comprising a glass such as a barium borosilicate glass, aluminoborosilicate glass or the like, typically #7059 glass, #1737 glass or the like manufactured by Corning, Inc. is prepared. It is noted that a quartz substrate, a silicon substrate, a metal substrate, or a stainless substrate, on which an insulating film is formed can be also used as the substrate 700. Moreover, a plastic substrate that can resist against the heat generated in the processes in this embodiment can be also used.

Next, an insulating film such as a silicon oxide film, a silicon nitride film, a silicon oxynitride film or the like is formed on the substrate 700 as a base film 701. In this embodiment, the base film 701 is formed in a two-layer structure, but it may be formed in a single-layer structure or in a laminated-layer structure of two or more layers. As a first layer of the base film 701, a silicon oxynitride film 701a is formed in thickness from 10 nm to 200 nm (preferably from 50 nm to 100 nm) by plasma CVD with $SiH_4$, $NH_3$, and $N_2O$ as reacting gas. In this embodiment, a silicon oxynitride film 701a (composition ratio: Si=32%, O=27%, N=24%, H=17%) having a thickness of 50 nm was formed. Then a silicon oxynitride film 701b is formed in thickness from 50 nm to 200 nm (preferably from 100 nm to 150 nm) as a second laser of the base film 701 by the plasma CVD with $SiH_4$ and $N_2O$ as reacting gas. In this embodiment, the silicon oxynitride film 701b (composition ratio: Si=32%, O=59%, N=7%, H=2%) having a thickness of 100 nm was formed.

Next, a semiconductor film 702 is formed on the base film. The semiconductor film 702 having an amorphous structure is formed in thickness from 25 nm to 80 nm by the known method (such as sputtering, LPCVD, plasma CVD or the like). The material for the semiconductor film is not limited, but it is preferable to use silicon or silicon germanium (SiGe) alloy. Next, a crystalline semiconductor film obtained by performing the laser crystallizing method is patterned in a desired shape so as to form semiconductor layers 802 to 806. Of course, not only the laser annealing method, but also it may be combined with the other known crystallizing methods (such as RTA method, thermal crystallizing method using the annealing furnace, thermal crystallizing method using catalyst such as nickel and the like).

When the crystalline semiconductor film is manufactured with the laser crystallizing method, a YAG laser, a $YVO_4$ laser, a YLF laser, a $YAlO_3$ laser, a ruby laser, a Ti:Sapphire laser and the like, each of which generates either in a pulse oscillation or in a CW oscillation can be used. When these lasers are used, it is preferable to employ a method to converge a laser beam emitted from the laser oscillator into rectangle or elliptical through an optical system and to irradiate the laser beam to the semiconductor film. A practitioner selects the condition for crystallization appropriately.

The plasma CVD is employed in this embodiment to form an amorphous silicon film in 66 nm thick. Then, the crystalline silicon film is formed by the laser crystallizing method with the fundamental wave emitted from the CW YAG laser and the second harmonic emitted from the CW $YVO_4$ laser according to the present invention, for example. This crystalline silicon film is patterned with photolithography method to form semiconductor layers 802 to 806.

After the semiconductor layers 802 to 806 are formed, a small amount of impurities (boron or phosphorous) may be doped in order to control the threshold of TFT.

Next, a gate insulating film 807 is formed to cover the semiconductor layers 802 to 806. The gate insulating film 807 is formed of an insulating film including silicon in thickness from 40 nm to 150 nm with the plasma CVD or the sputtering. In this embodiment, the gate insulating film 807 is formed of a silicon oxynitride film (composition ratio: Si=32%, O=59%, N=7%, H=2%) having a thickness of 110 nm with the plasma CVD. Of course, the gate insulating film may be formed of not only the silicon oxynitride film, but also other insulating film including silicon in a single-layer structure or in a laminated-layer structure.

When a silicon oxide film is used, the silicon oxide film can be formed by the plasma CVD with a mixture of TEOS (Tetraethyl Orthosilicate) and $O_2$, at a reaction pressure of 40 Pa, with a substrate temperature set from 300° C. to 400° C., by discharging at a high frequency (13.56 MHz) and with an electric density from 0.5 W/cm² to 0.8 W/cm². Thus manufactured silicon oxide film obtains a good characteristic as the gate insulating film by a thermal annealing at a temperature from 400° C. to 500° C. thereafter.

Figure 7A:
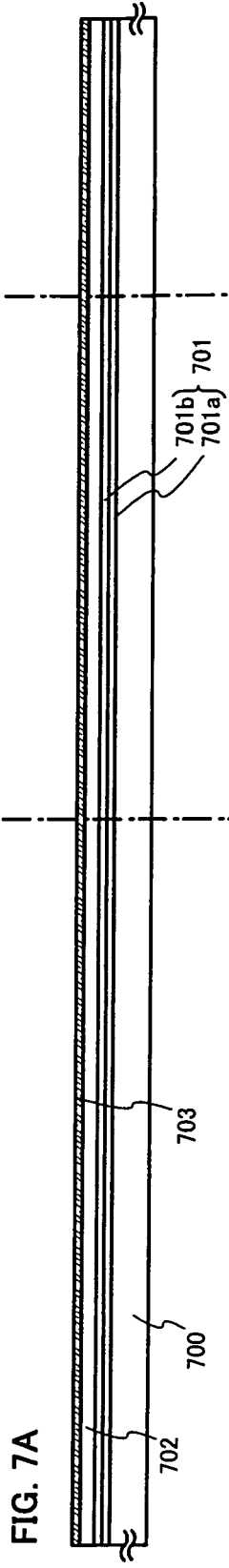
FIGS. 7A to 7C are drawings to explain a manufacturing process of TFT.
Figure 7B:
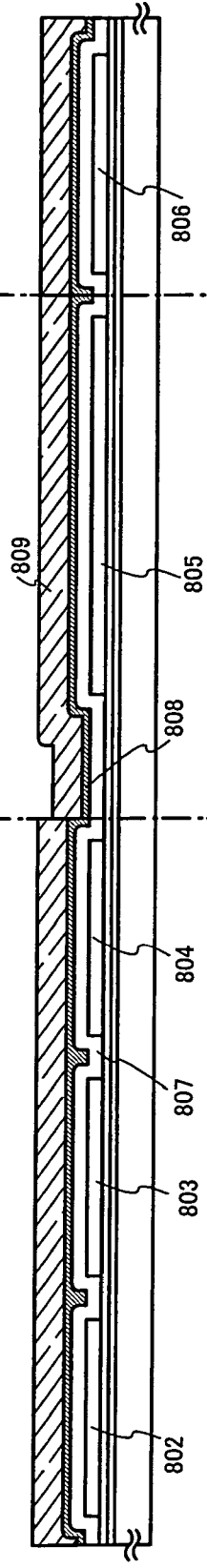
Figure 7C:
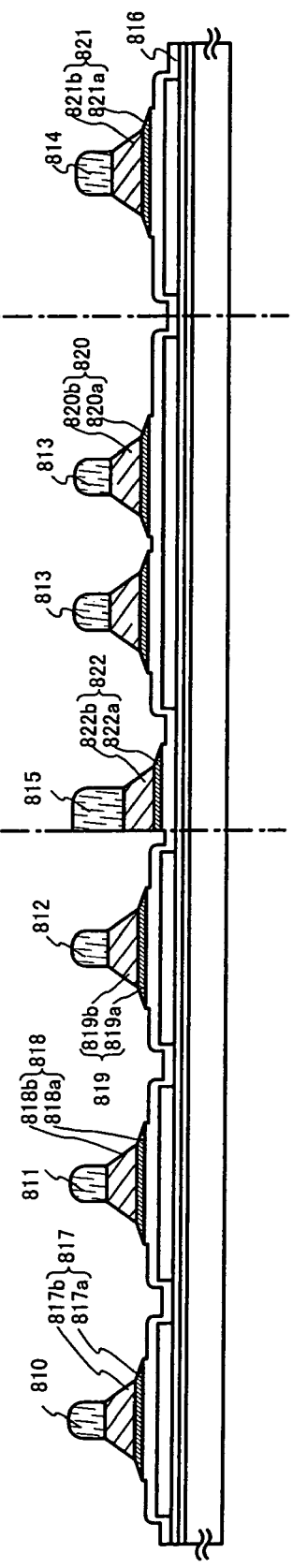

Next, a first conductive film 808 having a thickness from 20 nm to 100 nm and a second conductive film 809 having a thickness from 100 nm to 400 nm are formed in a laminated-layer structure on the gate insulating film 807 as shown in FIG. 7B. In this embodiment, the first conductive film 808 comprising a TaN film having a thickness of 30 nm, and the second conductive film 809 comprising a W film having a thickness of 370 nm were formed in a laminated-layer structure. The TaN film was formed with the sputtering, using Ta as a target in the atmosphere including nitrogen. The W film was formed with the sputtering, using W as a target. Instead of the sputtering, the W film can be also formed with thermal CVD using tungsten hexafluoride ($WF_6$). In any way, in order to use the W film as a gate electrode, it is necessary to make it low resistant, and thereby it is preferable to make the resistivity of the W film not more than 20 μΩcm. The W film can be made low resistant by enlarging its crystal grain, but when the W film includes a large amount of impurities such as oxygen, the crystallization is disturbed, and as a result it becomes high resistant. Therefore, in this embodiment, the W film was formed with the sputtering using high-purity W (purity 99.99%) as a target, and moreover very careful attention was paid when forming the W film so that the impurities in the vapor may not penetrate into the W film. Thus, it became possible to make its resistivity between 9 μΩcm and 20 μΩcm.

It is noted that in this embodiment, the first conductive film 808 was formed of TaN, the second conductive film 809 was formed of W, but the material for the conductive films are not limited to these elements. Both of the conductive films may be formed of the elements selected from the group consisting of Ta, W, Ti, Mo, Al, Cu, Cr and Nd, or may be formed of a chemical compound material or of an alloy material including the above element as its main component. In addition, the semiconductor film, typically a crystalline silicon film with the impurities such as phosphorus doped therein may be employed. Moreover, AgPdCu alloy can be also used. In addition, these conductive films may have a structure in which the first conductive film is formed of a tantalum (Ta) film and the second conductive film is formed of a W film, a structure in which the first conductive film is formed of a titanium nitride (TiN) film and the second conductive film is formed of a W film, a structure in which the first conductive film is formed of a tantalum nitride (TaN) film and the second conductive film is formed of an Al film, or a structure in which the first conductive film is formed of a tantalum nitride (TaN) film and the second conductive film is formed of a Cu film.

Next, after forming masks made from resist 810 to 815 with the photolithography, a first etching process is performed to form electrodes and wirings. The first etching process is performed in accordance with first and second etching conditions. An ICP (Inductively Coupled Plasma) etching method was employed as the first etching condition in this embodiment. The etching process was performed under the first etching condition in which $CF_4$, $Cl_2$ and $O_2$ were used as the etching gas at a gas flow rate 25:25:10 (sccm) respectively, and plasma was generated by applying 500 W RF (13.56 MHz) electric power to a coil shaped electrode at a pressure of 1.0 Pa. In this process, dry-etching device using ICP manufactured by Matsushita Electric Industrial Co., Ltd. (Model E645-ICP) was used. 150 W RF (13.56 MHz) electric power is also applied to the substrate side (sample stage), and thereby substantially a negative self-bias voltage is impressed. The W film is etched under the first etching condition, and the edge portion of the first conductive layer is made into a tapered shape.

Next, the etching process was performed under the second etching condition without removing the masks made from resist 810 to 815. In the second etching condition, $CF_4$ and $Cl_2$ were used as the etching gas at a gas flow rate 30:30 (sccm) and plasma was generated by applying 500 W RF (13.56 MHz) to a coil shaped electrode at a pressure of 1.0 Pa. Then the etching process is performed for about 30 seconds. 20 W RF (13.56 MHz) electric power is also applied to the substrate side (sample stage), and thereby substantially a negative self-bias voltage is impressed. Under the second etching condition using the mixed gas of $CF_4$ and $Cl_2$, the W film and the TaN film are both etched to the same extent. It is noted that in order to perform the etching process without leaving a remnant on the gate insulating film, the time for etching is increased by 10% to 20%.

In the first etching process described above, the end portions of the first and second conductive layers are made into the tapered shape due to the bias voltage impressed to the substrate side by optimizing the shape of the masks made from resist. And the tapered portions has an angle from 15° to 45°. Thus, first shaped conductive layers 817 to 822 (first conductive layers 817a to 822a and second conductive layers 817b to 822b) comprising the first conductive layer and the second conductive layer are formed. A reference number 816 is a gate insulating film. A region not covered with the first shaped conductive films 817 to 822 is etched between 20 nm and 50 nm approximately.

Figure 8A:
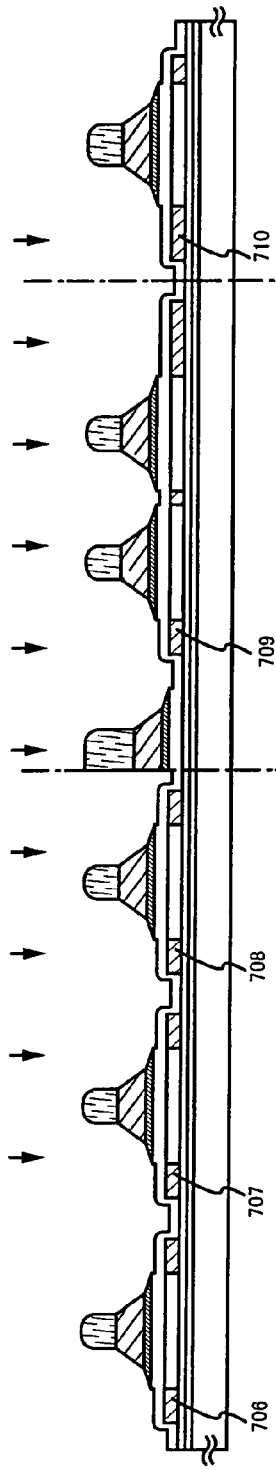
FIGS. 8A to 8C are drawings to explain a manufacturing process of TFT.

Then a first doping process is performed without removing the masks made from resist. The impurity element imparting n-type is doped in the semiconductor layer through this process (FIG. 8A). The first doping process may be performed by ion doping or ion implantation. The ion doping is performed under the condition in which the dosage ranges from $1 \times 10^{13}$ atoms/cm² to $5 \times 10^{15}$ atoms/cm², and the acceleration voltage ranges from 60 kV to 100 kV. In this embodiment, the dosage was set to $1.5 \times 10^{15}$ atoms/cm² and the acceleration voltage was set to 80 kV. A 15th element in the periodic table, typically phosphorus (P) or arsenic (As) is used as an impurity element imparting n-type. Phosphorus (P) was used in this embodiment. In such a case, first high-concentrated impurity regions 706 to 710 are formed in a self-aligning manner by using the conductive layers 817 to 821 as the masks against the impurities imparting n-type. The impurities imparting n-type are doped in the first high-concentrated impurity regions 706 to 710 at a concentration from $1 \times 10^{20}$ atoms/cm³ to $1 \times 10^{21}$ atoms/cm³.

Next, a second etching process is performed without removing the masks made from resist. The second etching process is performed under the condition in which $CF_4$, $Cl_2$ and $O_2$ are used as the etching gas to etch the W film selectively. Through the second etching process, the second conductive layers 828b to 833b are formed. On the other hand, the first conductive layers 817a to 822a are hardly etched, and thereby second shaped conductive layers 828 to 833 are formed.

Figure 8B:
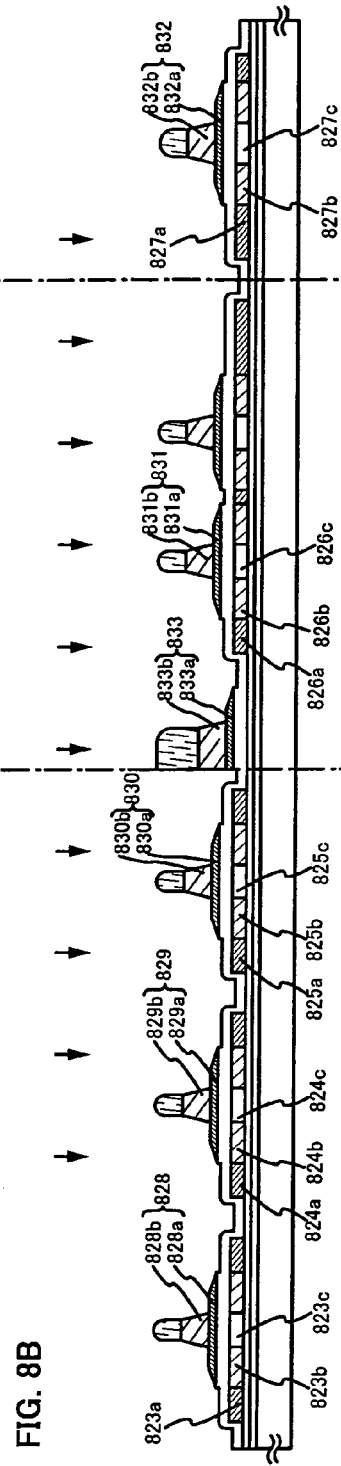

A second doping process is performed as shown in FIG. 8B without removing the masks made from resist. In this case, the dosage is set lower than that in the first doping process, and the impurities imparting n-type is doped at a high accelerating voltage from 70 kV to 120 kV. In this embodiment, the dosage was set to $1.5 \times 10^{14}$ atoms/cm² and the acceleration voltage was set to 90 kV. The second shaped conductive layers 828 to 833 are used as masks and the second doping process is performed so that the impurity element is doped also in the semiconductor layer provided below the second conductive layers 828b to 833b and thus second high-concentrated impurity regions 823a to 827a, and low-concentrated impurity regions 823b to 827b are newly formed.

Figure 8C:
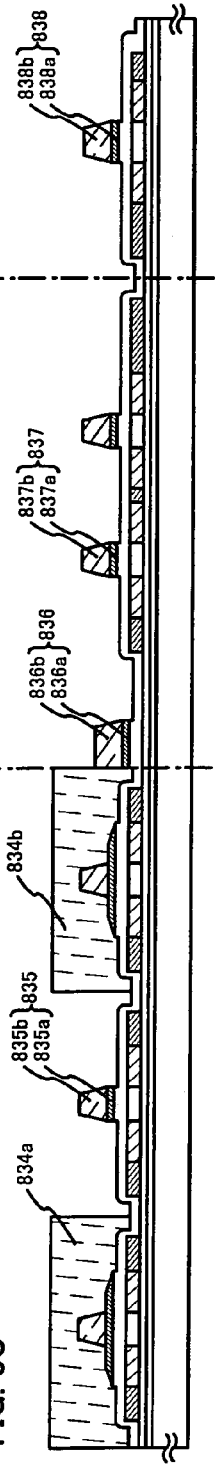

Next, after removing the mask made from resist, new masks made from resist 834a and 834b are formed, and a third etching process is performed as shown in FIG. 8C. $SF_6$ and $Cl_2$ are used as the etching gas at a gas flow rate 50:10 (sccm) and plasma is generated by applying 500 W RF (13.56 MHz) to a coil shaped electrode at a pressure of 1.3 Pa. Then the etching process is performed for about 30 seconds. 10 W RF (13.56 MHz) electric power is also applied to the substrate side (sample stage), and thereby substantially a negative self-bias voltage is impressed. Through the third etching process, the TaN film of p-channel TFT and TFT in pixel portion (pixel TFT) is etched to form third shaped conductive layers 835 to 838.

Figure 9A:
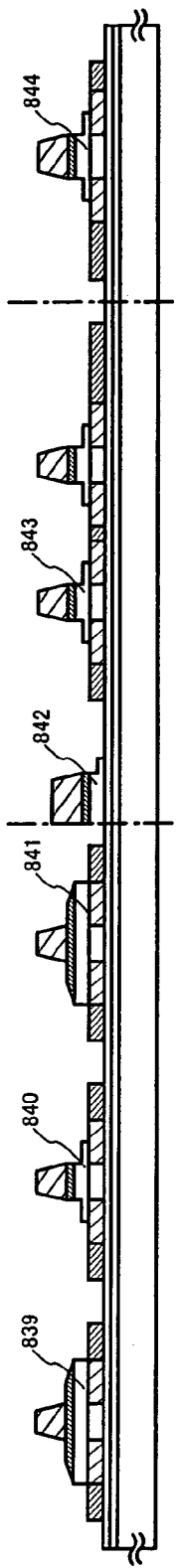
FIGS. 9A to 9C are drawings to explain a manufacturing process of TFT.

Next, after removing the mask made from resist, the second shaped conductive layers 828, 830 and the third shaped conductive layers 835 to 838 are used as the masks to remove the gate insulating film 816 selectively so as to form the insulating layers 839 to 844 (FIG. 9A).

Figure 9B:
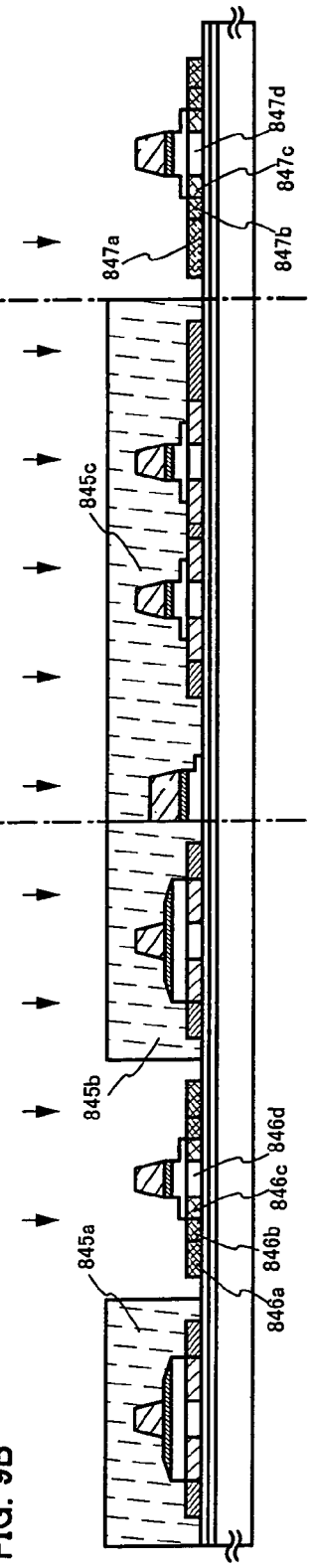

Next, after forming new masks 845a to 845c made from resist, a third doping process is performed. Through the third doping process, impurity regions 846 and 847 are formed by doping the impurities imparting conductivity type opposite to the former conductivity type to the semiconductor layer that will be an active layer of the p-channel TFT. The second conductive layers 835a and 838a are used as the masks against the impurities and the impurity element imparting p-type is doped to form the impurity region in a self-aligning manner. In this embodiment, the impurity regions 846 and 847 are formed with the ion doping with diborane ($B_2H_6$). (FIG. 9B) Through the third doping process, the semiconductor layer forming n-channel TFT is covered with the mask made from resist 845a to 845c. Although phosphorus is doped to the impurity regions 846 and 847 at a different concentration respectively through the first and the second doping processes, doping processes are performed so that the concentration of the impurities imparting p-type may be between $2 \times 10^{20}$ atoms/cm³ and $2 \times 10^{21}$ atoms/cm³ in both regions, and thereby these regions work as the source region and the drain region of p-channel TFT without any problems. In this embodiment, since a part of the semiconductor layer that will be the active layer of p-channel TFT is exposed, it has an advantage that the impurity element (boron) is easily doped.

The impurity region is formed in each semiconductor layer according to the above processes.

Next, masks made from resist 845a to 845c are removed and a first interlayer insulating film 861 is formed. The first interlayer insulating film 861 is formed of an insulating film including silicon having a thickness from 100 mm to 200 nm with the plasma CVD or the sputtering. In this embodiment, a silicon oxynitride film was formed 150 nm in thickness with the plasma CVD. Of course, not only the silicon oxynitride film, but also other insulating film including silicon may be used as the first interlayer insulating film 861 in a single-layer structure or in a laminated-layer structure.

Figure 9C:
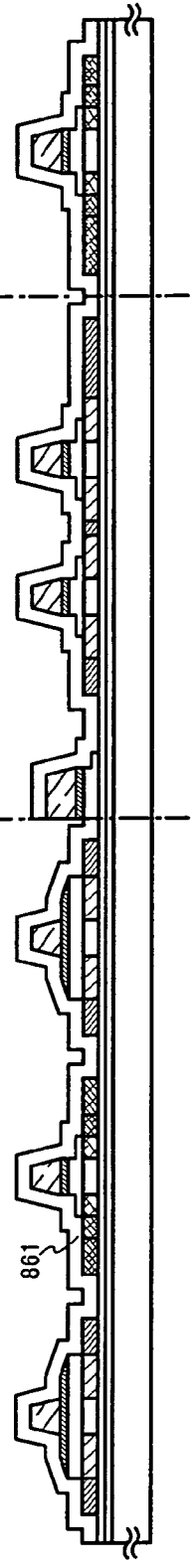

Next, a heating process is performed to recover the crystallinity of the semiconductor film, and to activate the impurity element doped in the respective semiconductor layers as shown in FIG. 9C. This heating process is performed with the thermal annealing method using an annealing furnace. The thermal annealing is performed in the atmosphere of nitrogen including oxygen not more than 1 ppm, preferably not more than 0.1 ppm, at a temperature from 400° C. to 700° C., typically from 500° C. to 550° C. In this embodiment, the heating process is performed at a temperature of 550° C. for four hours for the activation. Not only the thermal annealing method, but also laser annealing method and rapid thermal annealing method (RTA method) can be employed. As for the laser annealing method, the method shown in the embodiment mode may be employed. However, the gate or the like might be ablated depending on the given energy density. Therefore, the condition must be carefully selected.

In addition, a heating process may be performed before forming the first interlayer insulating film. However, when the material for the wirings does not have enough resistance against heat, it is preferable to form the interlayer insulating film (such as the insulating film including silicon as its main component, for example a silicon nitride film) in order to protect the wirings and the like before the activating process as shown in this embodiment.

Furthermore, a heating process is performed in the atmosphere including hydrogen from 3% to 100% at a temperature from 300° C. to 550° C. for one hour to 12 hours in order to hydrogenate the semiconductor layer. In this embodiment, the heating process was performed in the atmosphere of nitrogen including hydrogen for about 3% at a temperature of 410° C. for one hour. This process is to terminate the dangling bond in the semiconductor layer with hydrogen included in the interlayer insulating film. As the other means for hydrogenation, plasma hydrogenation (using hydrogen excited by plasma) may be performed.

When the conventional laser annealing method is employed for the activation process, it is preferable to irradiate the laser beam emitted from an excimer laser, YAG laser or the like.

Next, a second interlayer insulating film 862 comprising an inorganic insulating material or an organic insulating material is formed on the first interlayer insulating film 861. In this embodiment, the second interlayer insulating film 862 was formed of an acrylic resin film having a thickness of 1.6 μm, and having a viscosity from 10 cp to 1000 cp, preferably from 40 cp to 200 cp, whose surface can be made convex and concave.

In this embodiment, in order to prevent mirror reflection, concavity and convexity were formed on the surface of the pixel electrode by forming the second interlayer insulating film on which the concavity and convexity can be formed. And a convex portion may be formed in the region below the pixel electrode in order to scatter the light by making the surface of the pixel electrode concave and convex. In such a case, the convex portion can be formed with the same photo mask as that when forming the TFT, and thereby the number of the processes does not need to be increased. It is noted that the convex portion may be provided in the pixel region except for the wirings and TFT on the substrate appropriately. Concavity and convexity are thus formed on the surface of the pixel electrode along the concavity and convexity formed on the surface of the insulating film covering the convex portion.

Moreover, a film whose surface is planarized may be used as the second interlayer insulating film 862. In such a case, it is preferable that after forming the pixel electrodes, the surface is made concave and convex by adding the process such as the known sandblasting method, etching method or the like, to prevent the mirror reflection and to scatter the reflecting light so as to increase the degree of whiteness.

And in a driver circuit 906, wirings 863 to 867 connecting electrically to each impurity region are formed. It is noted that these wirings are formed by patterning the laminated film of the Ti film having a thickness of 50 nm, and an alloy film (alloy film of Al with Ti) having a thickness of 500 nm.

Figure 10:
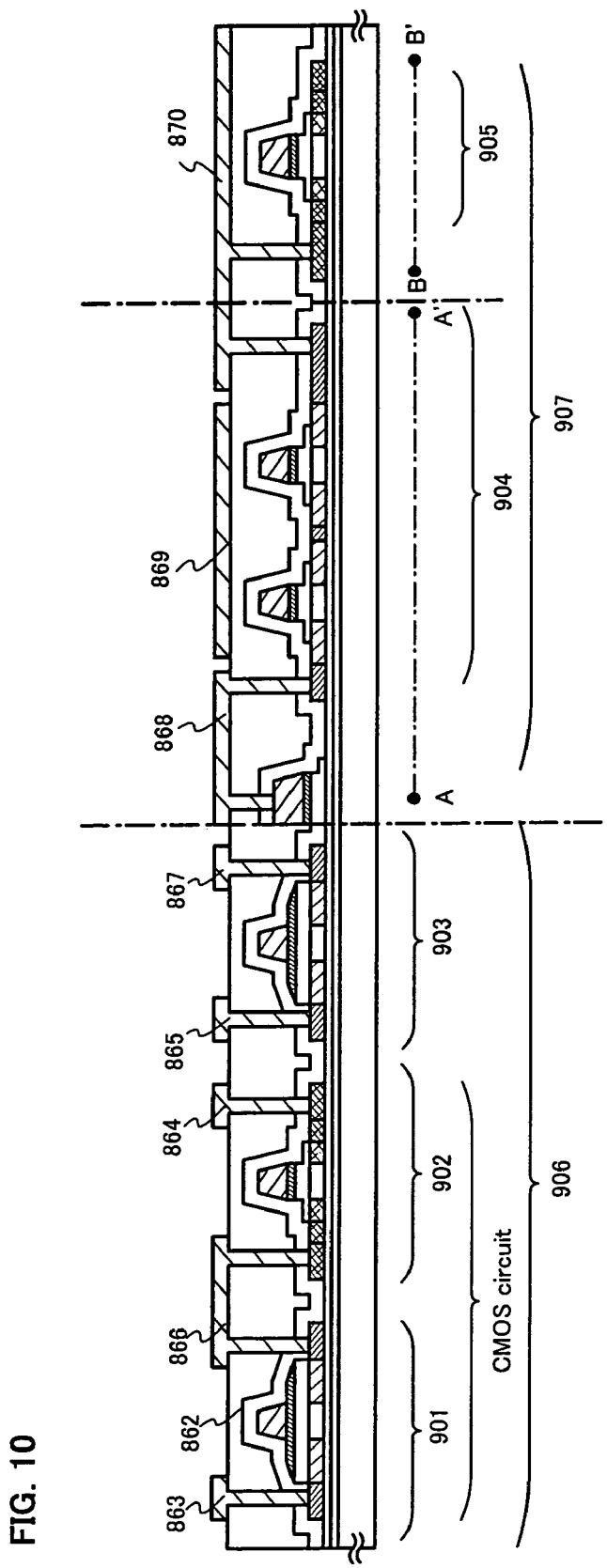
FIG. 10 is a drawing to explain a manufacturing process of TFT.

In the pixel portion 907, a pixel electrode 870, a gate wiring 869, and a connecting electrode 868 are formed (FIG. 10). The connecting electrode 868 forms an electrical connection between the source wiring (the laminated layer of 843b and 849) and the pixel TFT. In addition, the gate wiring 869 and the gate electrode of the pixel TFT are electrically connected. Moreover, the pixel electrode 870 is electrically connected with the drain region 842 of the pixel TFT and is further connected electrically with the semiconductor layer 858 working as one electrode forming the retention volume. In addition, it is preferable to form the pixel electrode 870 with the material having high reflectivity such as a film including Al or Ag as its main component or a laminated layer of the above film.

According to these processes, a driver circuit 906 having a CMOS circuit with an n-channel TFT 901 and p-channel TFT 902 included therein and an n-channel TFT 903, and a pixel portion 907 having a pixel TFT 904 and a retention volume 905 can be integrated on the same substrate. Thus, an active matrix substrate is completed.

The n-channel TFT 901 included in the driver circuit 906 has a channel forming region 823c, a low-concentrated impurity region 823b (GOLD region) overlapping with the first conductive layer 828a forming a part of the gate electrode, and a high-concentrated impurity region 823a functioning as a source region or a drain region. The p-channel TFT 902 forming a CMOS circuit by connecting this n-channel TFT 901 with the electrode 866 has a channel forming region 846d, impurity regions 846b and 846c formed outside the gate electrode, and a high-concentrated impurity region 846a functioning as a source region or a drain region. Moreover, the n-channel TFT 903 has a channel forming region 825c, a low-concentrated impurity region 825b (GOLD region) overlapping with the first conductive layer 830a forming a part of the gate electrode, and a high-concentrated impurity region 825a functioning as a source region or a drain region.

The pixel TFT 904 in the pixel portion has a channel forming region 826c, a low-concentrated impurity region 826b (LDD region) formed outside the gate electrode, and a high-concentrated impurity region 826a functioning as a source region or a drain region. And the semiconductor layers 847a and 847b functioning as one electrode of the retention volume 905 are doped with the impurities imparting p-type respectively. The retention volume 905 is formed of the electrode (the laminated layer of 838*a* with 838*b*) and the semiconductor layers 847*a* to 847*c*, having the insulating film 844 as its dielectric.

In addition, in this embodiment, the pixel is constructed in such a way that the space between the pixel electrodes is shielded from the light by having the ends of the pixel electrodes overlapped with the source wirings without forming black matrix.

Figure 11:
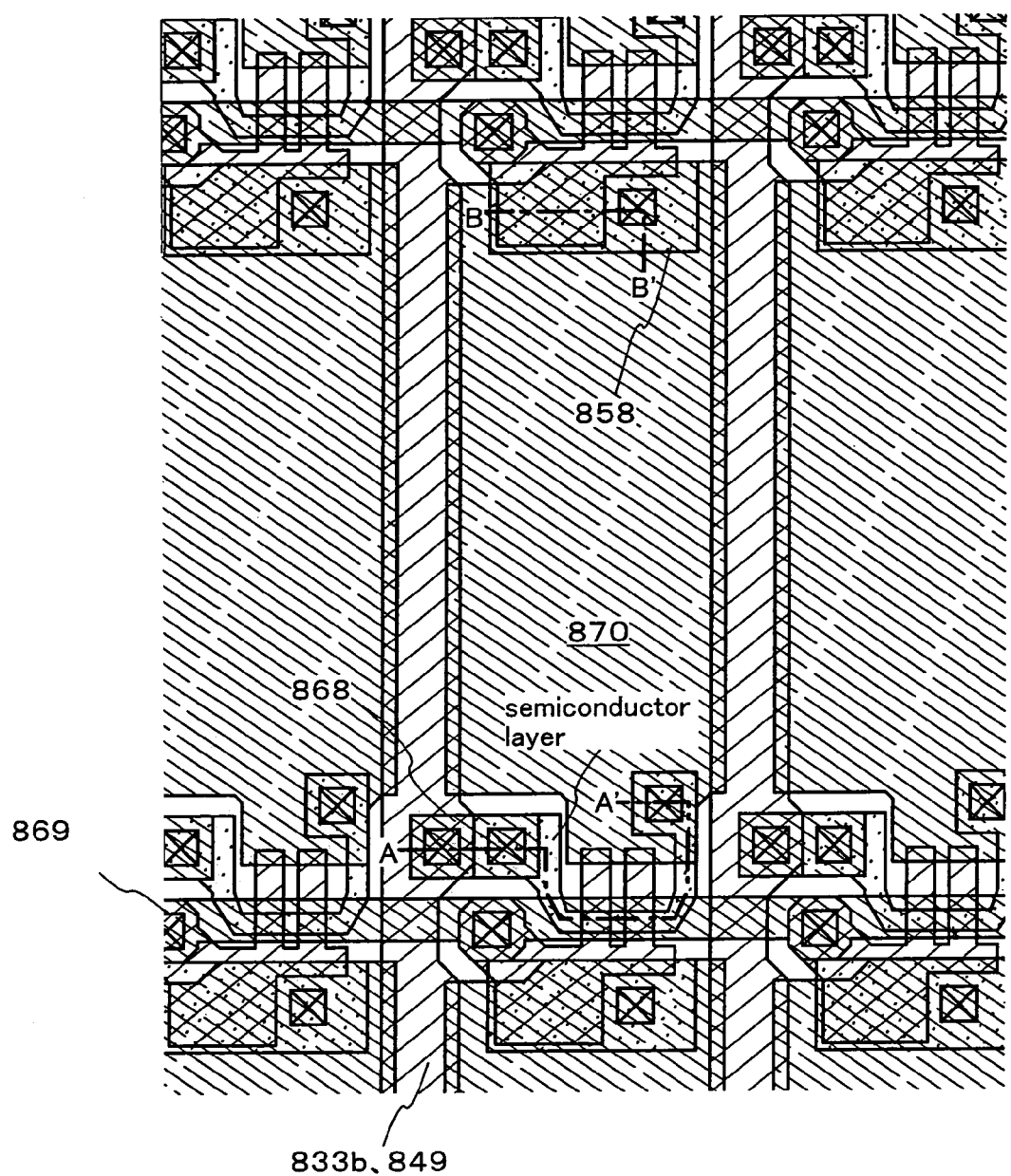
FIG. 11 is a top view of a pixel portion of TFT.

In addition, FIG. 11 is a top view of the pixel portion in the active matrix substrate manufactured in this embodiment. It is noted that the same reference number is used in the same part in FIGS. 7A to 10. A dotted line A-A' in FIG. 10 corresponds to a sectional view taken along a dotted line A-A' in FIG. 11. Moreover, a dotted line B-B' in FIG. 10 corresponds to a sectional view taken along a dotted line B-B' in FIG. 11

Embodiment 2

Figure 12:
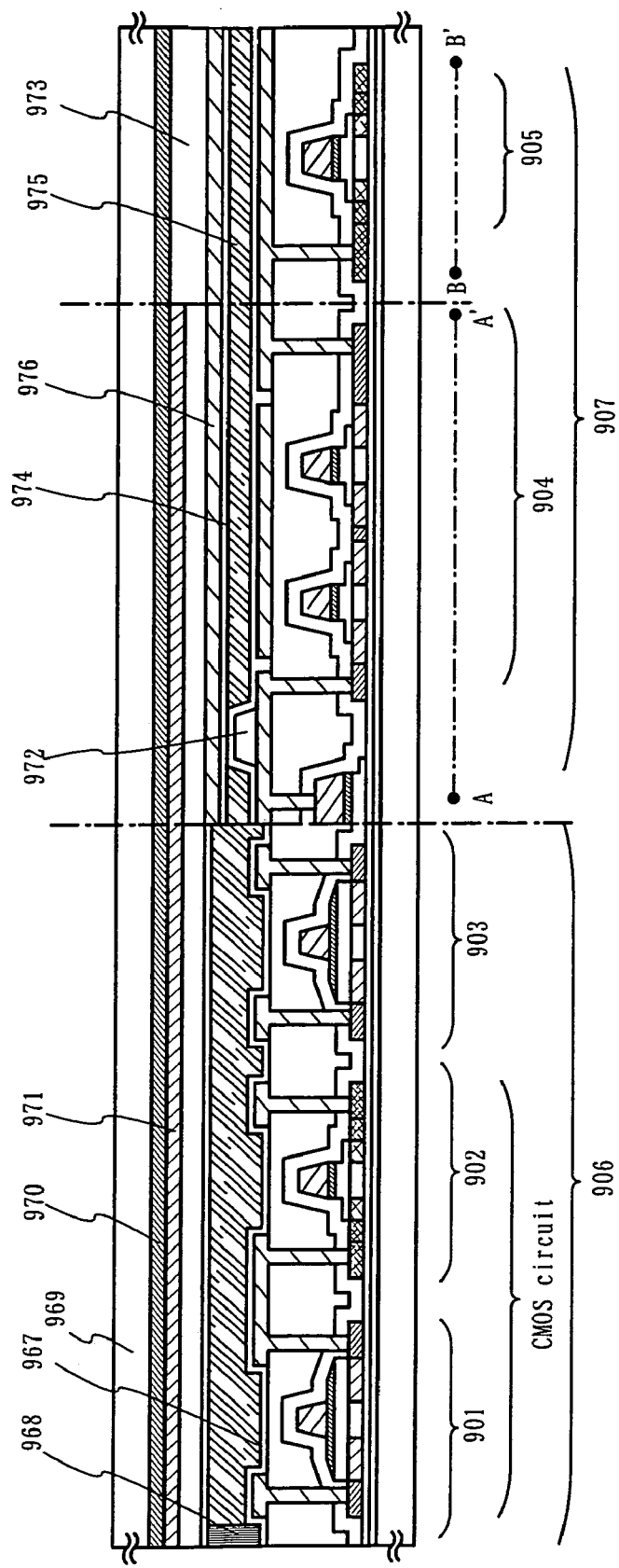
FIG. 12 is a sectional view to show a manufacturing process of an active matrix liquid crystal display device.

This embodiment explains a process to manufacture a liquid crystal display device of reflecting type out of the active matrix substrate manufactured in the embodiment 1. FIG. 12 is used for the explanation.

First of all, the active matrix substrate in a state shown in FIG. 10 is prepared according to the processes in the embodiment 1. Then, an alignment film 967 is formed on the active matrix substrate in FIG. 10, at least on the pixel electrode 870, and is rubbed. It is noted that before forming the alignment film 967, a polar spacer 972 was formed in the desired position in order to keep enough space between the substrates by patterning the organic resin film such as the acrylic resin film or the like in this embodiment. A spherical spacer may be dispersed all over the substrate instead of the polar spacer.

Next, an opposing substrate 969 is prepared. Then, coloring layers 970, 971 and a planarizing film 973 are formed on the opposing substrate 969. The red coloring layer 970 and the blue coloring layer 971 are overlapped to form a light-shielding portion. Alternatively the red coloring layer and the green coloring layer may be overlapped partially to form the light-shielding portion.

In this embodiment, the substrate shown in the embodiment 1 is used. Therefore, in FIG. 11 showing the top view of the pixel portion in the embodiment 1, it is necessary to shield the following spaces from the light; a space between the gate wiring 869 and the pixel electrode 870, a space between the gate wiring 869 and the connecting electrode 868, and a space between the connecting electrode 868 and the pixel electrode 870. In this embodiment, each coloring layer is arranged so that the light-shielding portions comprising the laminated coloring layers are overlapped on the position which should be shielded from the light as described above, and the opposing substrate was then pasted.

Thus, it became possible to reduce the number of processes by shielding the spaces between each pixel from the light with the light-shielding portion comprising the coloring layers without forming the light-shielding layer such as a black mask.

Next, an opposing electrode 976 comprising a transparent conductive film is formed on the planarizing film 973, at least on the pixel portion, and then an alignment film 974 is formed all over the surface of the opposing substrate and the opposing electrode 976 was rubbed.

And the active matrix substrate with the pixel portions and the driver circuits formed therein is pasted to the opposing substrate with sealing material 968. Filler is contained in the sealing material 968 and the two substrates are pasted while keeping a uniform space by this filler and the polar spacer. After that, liquid crystal material 975 is injected between the substrates and the two substrates are sealed with sealant (not shown in the figure) completely. The known liquid crystal material may be employed for the liquid crystal material 975. Thus, the liquid crystal display device of reflection type is completed. And if necessary, the active matrix substrate or the opposing substrate is cut into a desired shape. Moreover, a polarizing plate (not shown in the figure) was pasted only to the opposing substrate. And FPC (flexible printed circuit) was pasted with the known technique.

The liquid crystal display panel thus manufactured can be employed for the display portion in various kinds of the electrical devices.

It is noted that this embodiment can be freely combined with the embodiment 1.

Embodiment 3

This embodiment explains an example in which the present invention is applied to manufacture a light-emitting device. In this specification, the light-emitting device is a generic term for a display panel where the light-emitting element formed on the substrate is included between the substrate and the cover member, and for a display module having the display panel equipped with IC. It is noted that the light-emitting element has a layer including an organic compound giving electroluminescence by applying electric field (light-emitting layer), an anode layer and a cathode layer. And the luminescence in the organic compound includes one or both of the luminescence (fluorescence) when returning from the singlet excited state to the ground state, and the luminescence (phosphorescence) when returning from the triplet excited state to the ground state.

Figure 13:
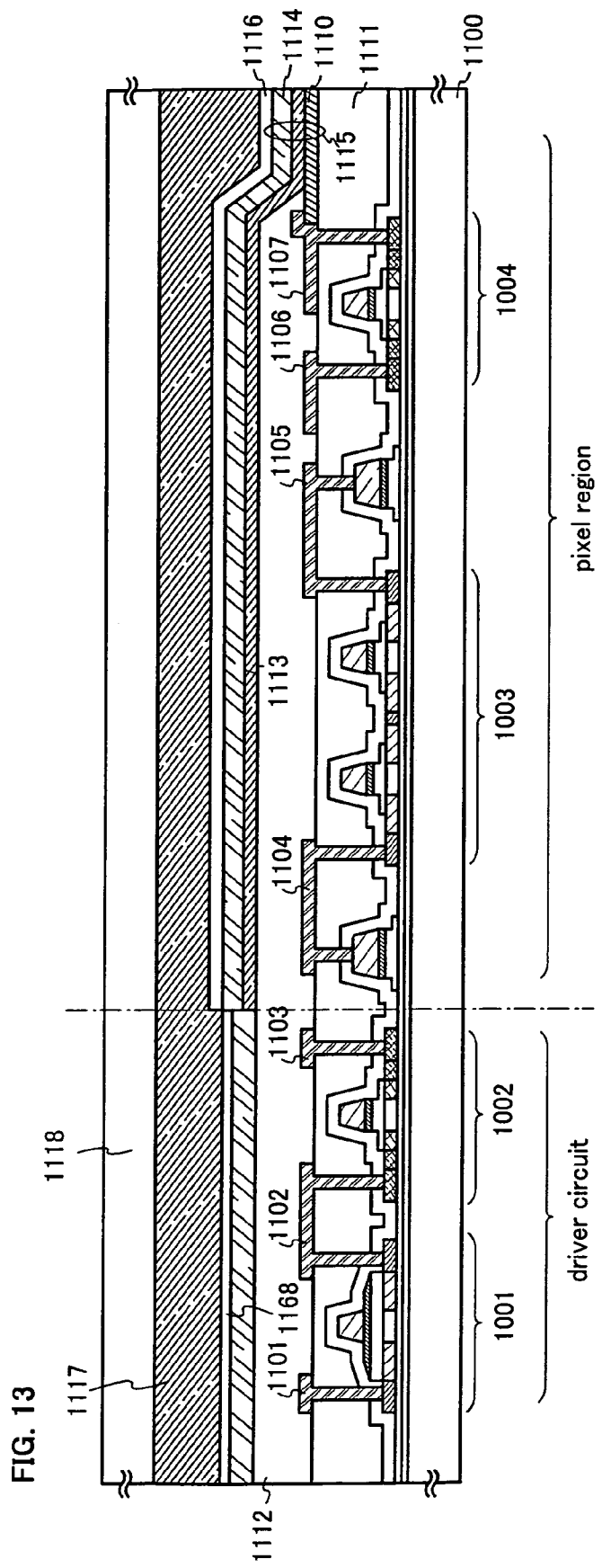
FIG. 13 is a sectional view to show a structure of a pixel portion and a driver circuit of the light-emitting device.

FIG. 13 is a sectional view of the light-emitting device in this embodiment. In FIG. 13, a switching TFT 1003 provided on the substrate 1100 is formed with the n-channel TFT 903 in FIG. 10. Therefore, concerning the structure of the switching TFT 1003, the explanation of the n-channel TFT 903 may be referred to.

It is noted that this embodiment explains a double-gate structure with two channel forming regions, but a single-gate structure with one channel forming region or triple-gate structure with three channel forming regions may be also employed.

The driver circuit provided on the substrate 1100 is formed with the CMOS circuit in FIG. 10. Therefore, concerning the structure of the driver circuit, the explanation about the structure of the n-channel TFT 901 and p-channel TFT 902 may be referred to. It is noted that this embodiment explains a single-gate structure, but a double-gate structure or a triple-gate structure may be also employed.

It is noted that the wirings 1101 and 1103 function as the source wiring of the CMOS circuit, and the wiring 1102 functions as the drain wiring of the CMOS circuit. In addition, the wiring 1104 functions as the wiring that electrically connects the source wiring 1108 and the source region of the switching TFT. The wiring 1105 functions as the wiring that connects electrically the drain wiring 1109 and the drain region of the switching TFT.

It is noted that a current controlling TFT 1004 is formed with the p-channel TFT 902 in FIG. 10. Therefore, concerning the structure of the current controlling TFT 1004, the explanation of the p-channel TFT 902 may be referred to. It is noted that in this embodiment, it is formed in a single-gate structure, but may be also formed in a double-gate or a triple-gate structure.

The wiring 1106 is the source wiring of the current controlling TFT (corresponding to the wiring for supplying electric) and a reference number 1107 is an electrode connecting electrically with the pixel electrode 1110 of the current controlling TFT by being overlapped on the pixel electrode 1110 thereof.

It is noted that a reference number 1110 is a pixel electrode (the anode of the light-emitting element) comprising the transparent conductive film. The transparent conductive film can be formed of a compound of indium oxide and tin oxide, a compound of indium oxide and zinc oxide, zinc oxide, tin oxide, or indium oxide. Moreover, the transparent conductive film doped with gallium may be also employed. The pixel electrode 1110 is formed on the flat interlayer insulating film 1111 before forming those wirings. In this embodiment, it is very important to planarize the steps due to the TFT with the planarizing film 1111 made from resin. The light-emitting layer formed later is so thin that the faulty luminance might occur due to the steps. Therefore, it is preferable to planarize before forming the pixel electrode so that the light-emitting layer is formed on the plane as flat as possible.

After forming the wirings 1101 to 1107, a bank 1112 is formed as shown in FIG. 13. The bank 1112 is formed by patterning the insulating film including silicon or the organic resin film, having a thickness from 100 nm to 400 nm.

It is noted that attention must be paid for the element when the bank 1112 is formed so that the element may not be damaged due to electrostatic discharge because the bank 1112 is an insulating film. In this embodiment, the resistivity is lowered by adding the carbon particle or the metal particle in the insulating film, that is a material for the bank 1112, so as to prevent the electrostatic. In such a case, the amount of the carbon particle or the metal particle is adjusted so that the resistivity is in the range of $1\times10^6$ Ωm to $1\times10^{12}$ Ωm (preferably from $1\times10^8$ Ωm to $1\times10^{10}$ Ωm).

A light-emitting layer 1113 is formed on the pixel electrode 1110. It is noted that FIG. 13 shows only one pixel but in this embodiment the light-emitting layers are made in parts corresponding to each color of R (red), G (green) and B (blue). In addition, in this embodiment, low molecular weight organic light-emitting element is formed with the deposition. Specifically, a laminated-layer structure is employed in which a copper phthalocyanine (CuPc) film having a thickness of 20 nm is formed as the hole injecting layer, and a tris-8-quinolinolato aluminum complex ($Alq_3$) film having a thickness of 70 nm is formed thereon as the light-emitting layer. Adding the pigment such as quinacridone, perylene, DCM1 or the like to $Alq_3$ can control the color.

However, the organic light-emitting material available for the light-emitting layer is not limited to those described above at all. The light-emitting layer, the charge transporting layer, and the charge injecting layer are freely combined to form the light-emitting layer (the layer for luminescence and for moving the carrier for the luminescence). For instance, this embodiment shows an example in which the low molecular weight organic light-emitting material is employed for the light-emitting layer, but the high molecular weight organic light-emitting material may be also employed. In addition, the inorganic material such as silicon carbide can be also used as the charge transporting layer and the charge injecting layer. The known material can be used for these organic light-emitting material and inorganic material.

Next, a cathode 1114 comprising the conductive film is provided on the light-emitting layer 1113. In case of this embodiment, an alloy film of aluminum and lithium is used as the conductive film. Of course, the known MgAg film (the alloy film of magnesium and silver) can be also used. A conductive film formed of the 1st or 2nd element in the periodic table or a conductive film doped with the above element can be used as the cathode material.

When the processes are performed up to forming the cathode 1114, the light-emitting element 1115 is completed. It is noted that the light-emitting element 1115 described here indicates a diode formed of the pixel electrode (anode) 1110, the light-emitting layer 1113 and the cathode 1114.

It is effective to provide a passivation film 1116 so as to cover the light-emitting element 1115 completely. The passivation film 1116 is formed of the insulating film comprising a carbon film, a silicon nitride film, or a silicon nitride oxide film, in a single-layer structure or in a laminated-layer structure with these insulating films combined.

Here, it is preferable to employ the film whose coverage is good as the passivation film, and it is effective to employ the carbon film, especially a DLC (diamond-like carbon) film. The DLC film can be formed at a temperature from the room temperature to 100° C. Therefore, it is easily formed over the light-emitting layer 1113 having low resistance against heat. Moreover, the DLC film is superior in its blocking effect against oxygen, and thereby it is possible to suppress oxidization of the light-emitting layer 1113. Therefore, it can prevent the light-emitting layer 1113 from being oxidized during the following sealing process.

Moreover, the sealant 1117 is provided on the passivation film 1116 to paste the cover member 1118. A UV cure resin may be used as the sealant 1117 and it is effective to provide the absorbent material or antioxidant material inside. In addition, in this embodiment, the cover member 1118 is a glass substrate, a quartz substrate, or a plastic substrate (including plastic film), having carbon films (preferably DLC films) formed on opposite sides of the substrate.

Thus, the light-emitting device having the structure shown in FIG. 13 is completed. It is effective to perform continuously all the processes after forming the bank 1112 up to forming the passivation film 1116 in the deposition system of multi-chamber type (or in-line type) without releasing it to the air. Furthermore, it is possible to have the processes up to pasting the cover member 1118 performed continuously without releasing it to the air with the further development.

Thus, n-channel TFT 1001, 1002, a switching TFT (n-channel TFT) 1003, and a current controlling TFT (n-channel TFT) 1004 are formed on an insulator mainly made of a plastic substrate. The number of masks needed in these manufacturing processes is less than that in manufacturing a general active matrix light-emitting device.

That is to say, the process for manufacturing TFT is simplified to a large degree, and thereby the yield can be boosted, and the production cost can be lowered.

In addition, as explained with FIG. 13, providing an impurity region overlapped on the gate electrode through the insulating film can form the n-channel TFT that has enough resistance against deterioration due to the hot-carrier effect. Therefore, the light-emitting device with high reliability can be obtained.

Although this embodiment shows only the structure of the pixel portion and the driver circuit, another logical circuits such as a signal divider circuit, a D/A converter, an operational amplifier, a γ correction circuit and the like can be further formed on the same insulating substrate according to the manufacturing process in this embodiment. Moreover, a memory and a microprocessor can be further formed.

Figure 14A:
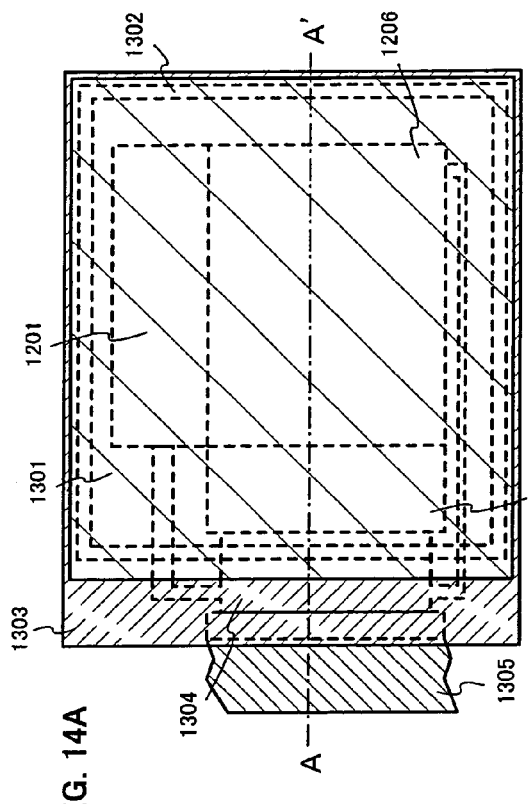
FIGS. 14A and 14B are drawings to show a pixel portion and a driver circuit of the light-emitting device.
Figure 14B:
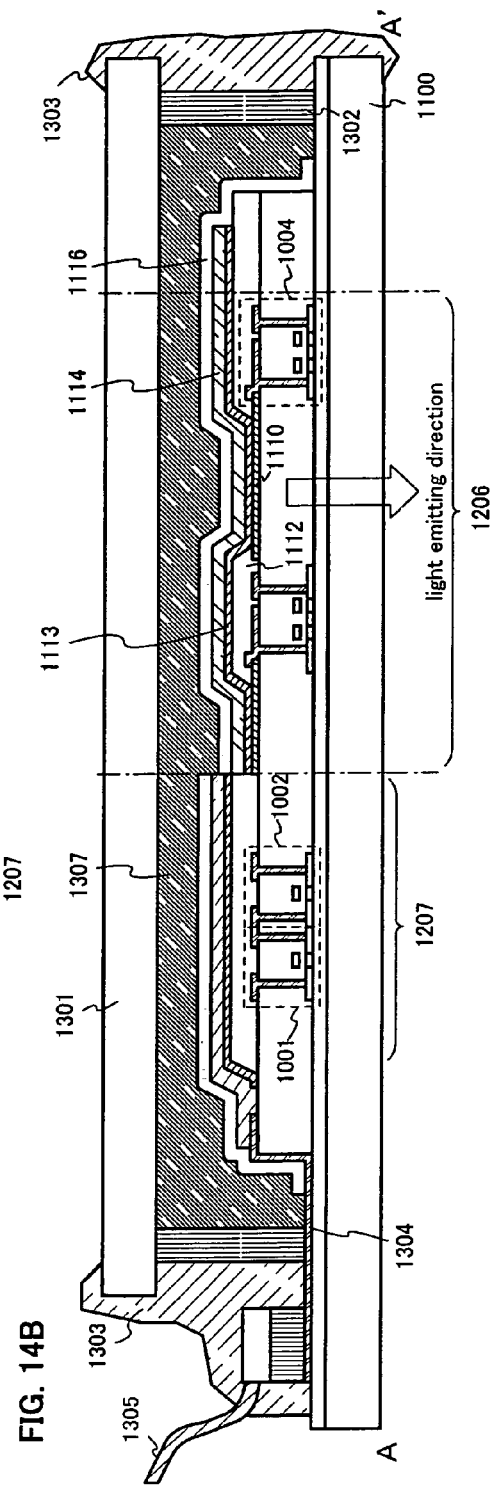

Furthermore, the light-emitting device in this embodiment in which a process up to sealing (or the enclosure) in order to protect the light-emitting element is performed, is explained with FIGS. 14A and 14B. It is noted that a reference number used in FIG. 13 is referred to if necessary.

FIG. 14A is a top view to show an aspect in which the process up to the sealing of the light-emitting element is performed. FIG. 14B is a sectional view taken along C-C' in FIG. 14A A reference number 1205 drawn with a dotted line is a source side driver circuit, a reference number 1206 is a pixel portion, and a reference number 1207 is a gate side driver circuit. In addition, a reference number 1301 is a cover member, 1302 is a first sealing material, 1303 is a second sealing material, and 1307 is a sealant provided in the space surrounded by the first sealing material 1302.

It is noted that a reference number 1304 is a wiring to transmit a signal input in the source side driver circuit 1205 and the gate side driver circuit 1207, and it receives a video signal or a clock signal from FPC 1305 that is an external input terminal. In addition, although only FPC is described here, this FPC may be equipped with a printed-wiring board (PWB). The light-emitting device in this specification includes not only the light-emitting device itself, but also the light-emitting device with FPC or PWB equipped.

Next, the sectional structure is explained with FIG. 14B. The pixel portion 1206 and the gate side driver circuit 1207 are formed above the substrate 1100. The pixel portion 1206 is formed of the current controlling TFT 1004 and a plurality of pixels including the pixel electrode 1110 connected electrically with the drain of the current controlling TFT 1004. In addition, the gate side driver circuit 1207 is formed of a CMOS circuit with the n-channel TFT 1001 and the p-channel TFT 1002 combined.

The pixel electrode 1110 functions as the anode of the light-emitting element. In addition, the bank 1112 is formed on opposite ends of the pixel electrode 1110, and the light-emitting layer 1113 and the cathode 1114 of the light-emitting element is formed on the pixel electrode 1110.

The cathode 1114 also functions as the wiring common to all the pixels and is connected electrically to FPC 1305 through the connecting wiring 1304. Further, all the elements included in the pixel portion 1206 and the gate side driver circuit 1207 are covered with the cathode 1114 and the passivation film 1116.

Moreover, the cover member 1301 is pasted with the first sealing material 1302. It is noted that a spacer made from a resin film may be provided in order to keep the space between the cover member 1301 and the light-emitting element. And the sealant 1307 is filled inside the first sealing material 1302. It is preferable to employ epoxy resin as the first sealing material 1302 and the sealant 1307. In addition it is desirable to employ the material which hardly transmits moisture and oxygen for the first sealing material 1302. Moreover, the material having moisture-absorption characteristics or the material providing protection against oxidization may be included inside the sealant 1307.

The sealant 1307 provided so as to cover the light-emitting element also functions as an adhesive material in order to adhere the cover member 1301. In addition, FRP (Fiberglass-Reinforced Plastics), PVF (polyvinyl fluoride), mylar, polyester, or acrylic can be employed as the material for a plastic substrate 1301a constituting the cover member 1301.

In addition, after adhering the cover member 1301 with the sealant 1307, the second sealing material 1303 is provided so as to cover the side surface (the exposed side) of the sealant 1307. The second sealing material 1303 can be formed of the same material as that of the first sealing material 1302.

Enclosing the light-emitting element into the sealant 1307 with the above structure makes it possible to shield the light-emitting element from outside completely, and thereby the material such as moisture and oxygen promoting deterioration due to oxidization of the light-emitting layer can be prevented from penetrating from outside. Therefore, a light-emitting device with high reliability can be obtained.

It is noted that this embodiment can be freely combined with embodiment 1 or 2.

Embodiment 4

This embodiment explains with FIGS. 15A to 17D a semiconductor device with the active matrix type liquid crystal display device by TFT circuit of the present invention incorporated therein.

As the example of such a semiconductor device, a personal digital assistant (such as an electronic data book, a mobile computer, a cellular phone and the like), a video camera, a still camera, a personal computer, a television and the like are given. FIGS. 15A to 16C show these examples.

Figure 15A:
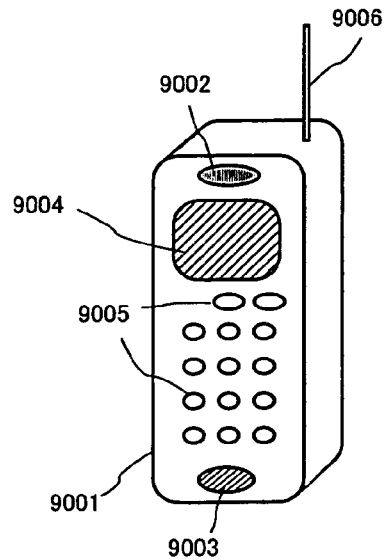
FIGS. 15A to 15E are drawings to show examples of the semiconductor devices.

FIG. 15A shows a cellular phone, including a main body 9001, a voice output portion 9002, a voice input portion 9003, a display device 9004, an operating switch 9005, and an antenna 9006. The present invention can be applied to the voice output portion 9002, the voice input portion 9003, and the display device 9004 with the active matrix substrate equipped.

Figure 15B:
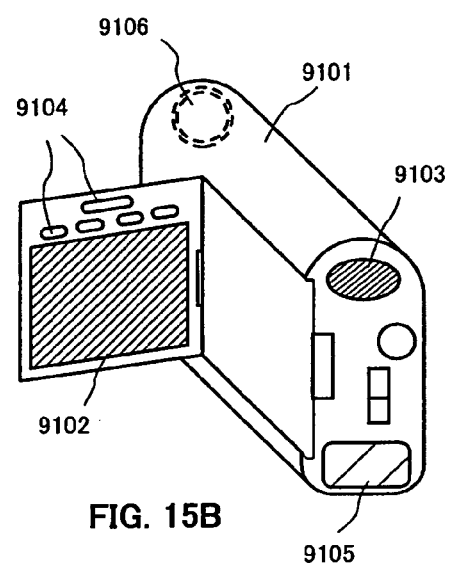

FIG. 15B shows a video camera, including a main body 9101, a display device 9102, a voice input portion 9103, an operating switch 9104, a battery 9105, and an image receiver 9106. The present invention can be applied to the voice input portion 9103, the image receiver 9106 and the display device 9102 with the active matrix substrate equipped.

Figure 15C:
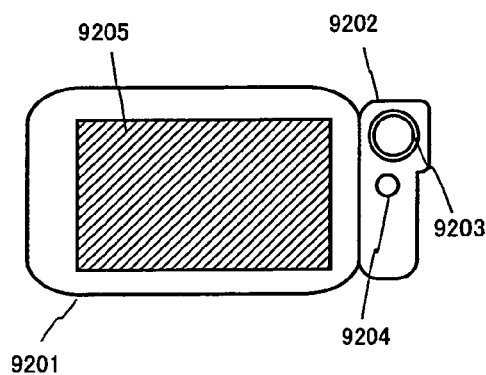

FIG. 15C shows a mobile computer or a personal digital assistant, including a main body 9201, a camera portion 9202, an image receiver 9203, an operating switch 9204, and a display device 9205. The present invention can be applied to the image receiver 9203 and the display device 9205 with the active matrix substrate equipped.

Figure 15D:
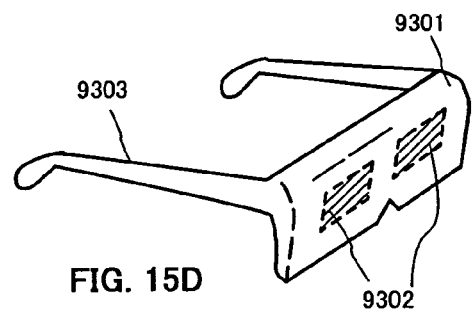

FIG. 15D shows a goggle type display, including a main body 9301, a display device 9302, and an arm portion 9303. The present invention can be applied to the display device 9302. In addition, the present invention can be applied to other signal controlling circuits though they are not shown in the figure.

Figure 15E:
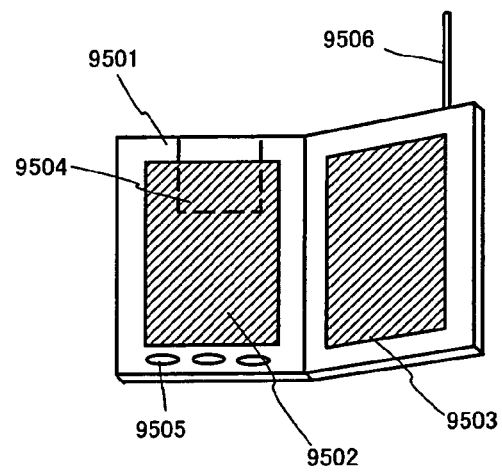

FIG. 15E shows a mobile book, including a main body 9501, display devices 9502 and 9503, a recording medium 9504, an operating switch 9505, and an antenna 9506. The mobile book is to display the data received with the antenna 9506 or the data recorded in a minidisk (MD) and DVD. The present invention can be applied to the display devices 9502 and 9503, that are direct view displays.

Figure 16A:
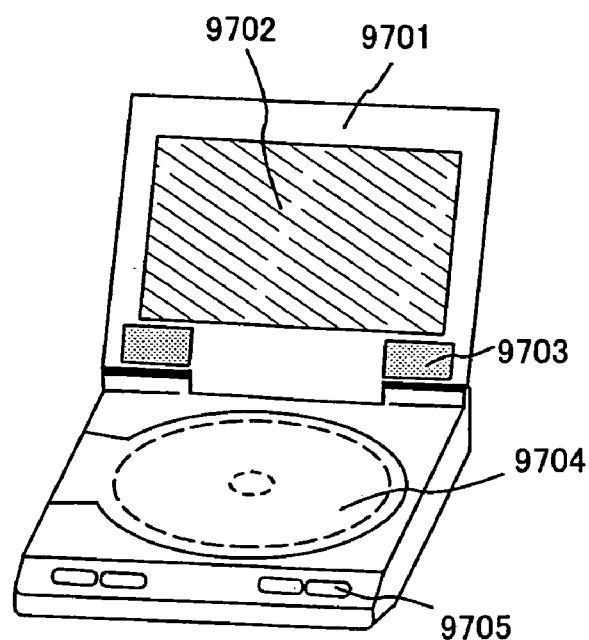
FIGS. 16A to 16C are drawings to show examples of the semiconductor devices.

FIG. 16A shows a player utilizing a recording medium that has a program recorded (hereinafter referred to as a recording medium) including a main body 9701, a display device 9702, a speaker portion 9703, a recording medium 9704, and an operating switch 9705. It is noted that this player makes it possible to enjoy listening to the music, watching the movie, playing the game, and playing on the Internet using a DVD (Digital Versatile Disc), CD or the like as its recording medium.

Figure 16B:
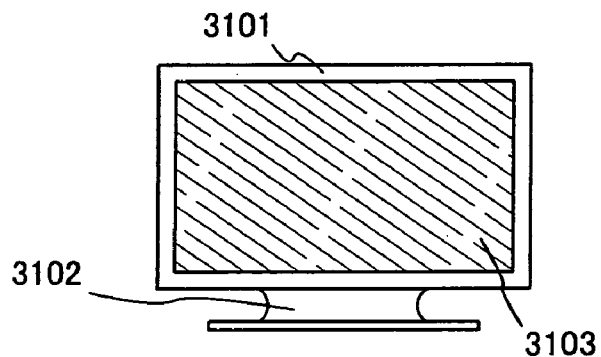

FIG. 16B shows a television, including a main body 3101, a supporting stand 3102, and a display portion 3103.

Figure 16C:
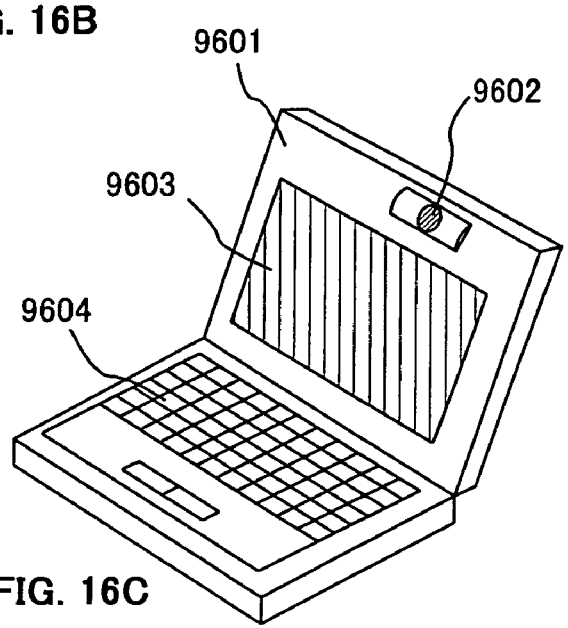

FIG. 16C shows a personal computer, including a main body 9601, an image input portion 9602, a display device 9603, and a keyboard 9604.

Figure 17A:
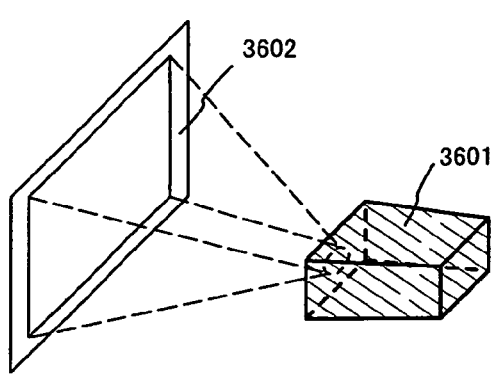
FIGS. 17A to 17D are drawings to show examples of the semiconductor devices.

FIG. 17A shows a front projector, including a projection device 3601, and a screen 3602. The present invention can be applied to the projection device 3601 and the other signal controlling circuits.

Figure 17B:
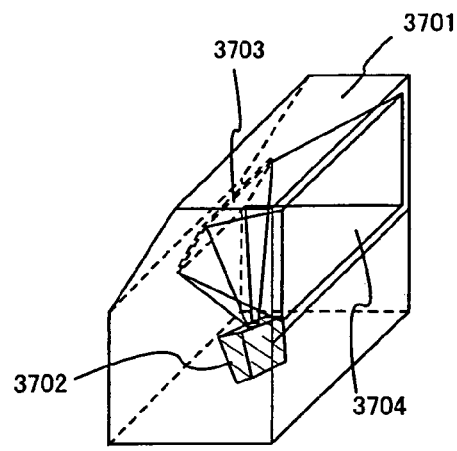

FIG. 17B shows a rear projector, including a main body 3701, a projection device 3702, a mirror 3703, and a screen 3704. The present invention can be applied to the projection device 3702 and the other signal controlling circuits.

Figure 17C:
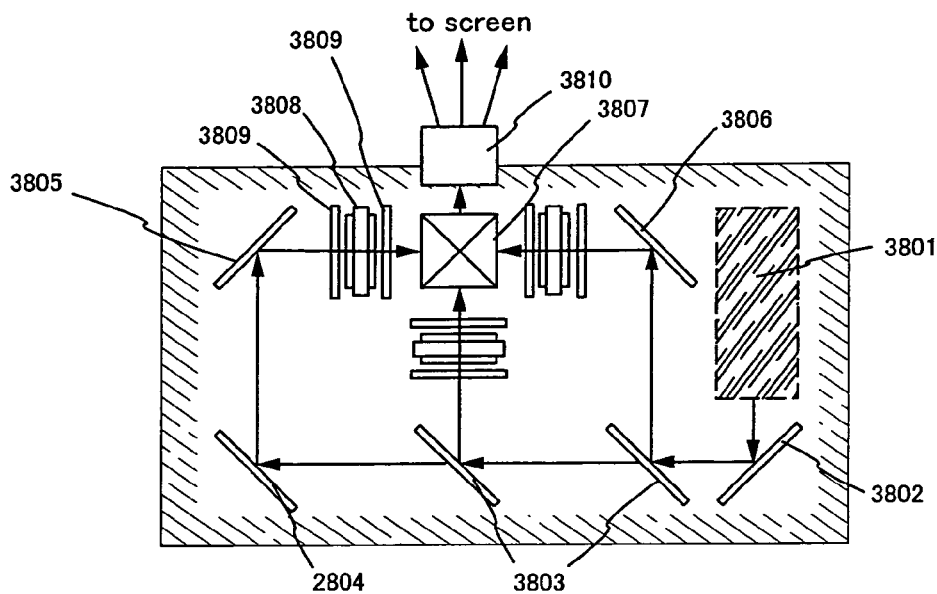

It is noted that FIG. 17C is a drawing to show an example of the structure of the projection device 3601 in FIG. 17A and the projection device 3702 in FIG. 17B. The projection devices 3601 and 3702 include an optical system of light source 3801, mirrors 3802, 3804 to 3806, a dichroic mirror 3803, a prism 3807, a liquid crystal display device 3808, a wave plate 3809, and a projection optical system 3810. The projection optical system 3810 comprises an optical system including a projection lens. This embodiment showed the projection device of three-plate type, but there is no limitation on this, and the projection device of single-plate type is also acceptable. Moreover, the practitioner may arrange an optical lens, a film having a polarizing function, a film for adjusting phase contrast, an IR film or the like in the optical path shown by an arrow in FIG. 17C.

Figure 17D:
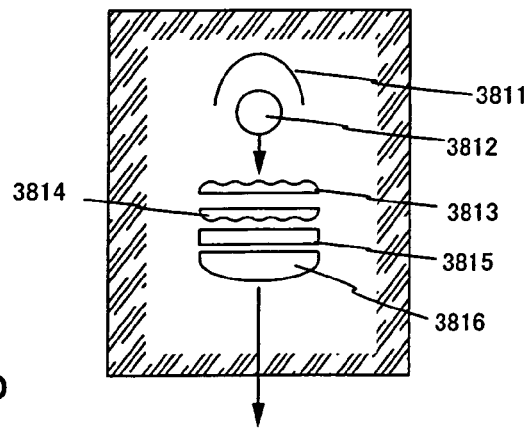

Moreover, FIG. 17D shows an example of the structure of the optical system of light source 3801 in FIG. 17C. The optical system of light source 3801 includes a reflector 3811, a light source 3812, lens arrays 3813 and 3814, a polarization changing element 3815, and a converging lens 3816. It is noted that the optical system of light source shown in FIG. 17D is just one of the examples, and is not limited to that described above. For example, the practitioner may provide an optical lens, a film having a polarizing function, a film for adjusting phase contrast, an IR film or the like in the optical system appropriately.

Furthermore, the present invention can be also applied to a display element of light-emitting type. As described above, the present invention can be applied to various kinds of devices, and can be applied to the electronics in every field. It is noted that the electronics in this embodiment can be freely combined with any of the embodiments 1 to 3.

What is claimed is:

1. A laser irradiation method comprising;
    shaping a first pulsed laser beam having a wavelength not longer than that of visible light into a long beam on a surface, and
    moving the surface while irradiating the surface with a second laser beam having a fundamental wave so that a region irradiated with the second laser beam overlap with a region irradiated with the first pulsed laser beam,
    wherein an output of the second laser beam is increased when an output of the first pulsed laser beam is decreased.

2. A laser irradiation method according to claim 1, wherein a net energy of the first pulsed laser beam and the second laser beam absorbed in the surface per unit time is controlled to be constant.

3. A laser irradiation method according to claim 1,
    wherein the first pulsed laser beam is emitted from an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, or a gold vapor laser.

4. A laser irradiation method according to claim 1,
    wherein the second laser beam is emitted from an Ar laser, a Kr laser, a $CO_2$ laser, a YAG laser, a $Y_2O_3$ laser, a $YVO_4$ laser, a YLF laser, a $YAlO_3$ laser, an alexandrite laser, a Ti:Sapphire laser or a helium-cadmium laser.

5. A laser irradiation method according to claim 1,
    wherein the surface is on a film formed over a substrate having a thickness d,
    wherein the substrate is transparent to the first pulsed laser beam and the second laser beam, and
    wherein an incidence angle $\phi 1$ of the first pulsed laser beam to the surface satisfies an inequality $\phi 1 \geq \arctan(W1/2d)$, when a side of the long beam, which is on an incidence plane and on the surface, is assumed to have a length of W1.

6. A laser irradiation method according to claim 1,
    wherein the surface is a film formed over a substrate having a thickness d,
    wherein the substrate is transparent to the first pulsed laser beam and the second laser beam, and
    wherein an incidence angle $\phi 2$ of the first pulsed laser beam to the surface satisfies an inequality $\phi 2 \geq \arctan(W2/2d)$, when a side of the long beam, which is on an incidence plane and on the surface, is assumed to have a length of W2.

7. A method for manufacturing a semiconductor device comprising;
    forming a semiconductor film over a substrate,
    shaping a first pulsed laser beam having a wavelength which is absorbed in the semiconductor film into a long beam on a surface of the semiconductor film, and
    moving the substrate while irradiating the surface with a second laser beam having a fundamental wave so that a region irradiated with the second laser beam overlap a region irradiated with the first pulsed laser beam,
    wherein an output of the second laser beam is increased when an output of the first pulsed laser beam is decreased.

8. A method for manufacturing a semiconductor device according to claim 7, wherein a net energy of the first pulsed laser beam and a second laser beam absorbed in the semiconductor film per unit time is controlled to be constant.

9. A laser irradiation method according to claim 7, wherein a wavelength of the first pulsed laser beam is not longer than that of visible light.

10. A method for manufacturing a semiconductor device according to claim 7,
    wherein the first pulsed laser beam is emitted from an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:Sapphire laser, a copper vapor laser, or a gold vapor laser.

11. A method for manufacturing a semiconductor device according to claim 7,
    wherein the second laser beam is emitted from an Ar laser, a Kr laser, a $CO_2$ laser, a YAG laser, a $Y_2O_3$ laser, a $YVO_4$ laser, a YLF laser, a $YAlO_3$ laser, an alexandrite laser, a Ti:Sapphire laser or a helium-cadmium laser.

12. A method for manufacturing a semiconductor device according to claim 7,
    wherein the substrate has a thickness d,
    wherein the substrate is transparent to the first pulsed laser beam and the second laser beam, and
    wherein an incidence angle $\phi 1$ of the first pulsed laser beam to the surface of the semiconductor film satisfies an inequality $\phi 1 \geq \arctan(W1/2d)$, when a side of the long beam, which is on an incidence plane and on the surface of the semiconductor film, is assumed to have a length of W1.

13. A method for manufacturing a semiconductor device according to claim 7,
    wherein the substrate has a thickness d,
    wherein the substrate is transparent to the first pulsed laser beam and the second laser beam, and
    wherein an incidence angle $\phi 2$ of the first pulsed laser beam to the surface of the semiconductor film satisfies an inequality $\phi 2 \geq \arctan(W2/2d)$, when a side of the long beam, which is on an incidence plane and on the surface of the semiconductor film, is assumed to have a length of W2.

* * * * *